(12) United States Patent
Belady et al.

(10) Patent No.: US 8,032,767 B2
(45) Date of Patent: Oct. 4, 2011

(54) POWER-EFFICIENT STATE SETTING OF DATA-CENTER ELEMENTS

(75) Inventors: Christian L. Belady, Mercer Island, WA (US); James R. Hamilton, Bellevue, WA (US); Sean M. James, Olympia, WA (US)

(73) Assignee: Microsoft Corporation, Redmond, WA (US)

( * ) Notice: Subject to any disclaimer, the term of this patent is extended or adjusted under 35 U.S.C. 154(b) by 774 days.

(21) Appl. No.: 12/060,876

(22) Filed: Apr. 2, 2008

(65) Prior Publication Data

US 2009/0254763 A1 Oct. 8, 2009

(51) Int. Cl.
*G06F 1/26* (2006.01)
(52) U.S. Cl. .......................... 713/300; 713/320; 713/323
(58) Field of Classification Search .................. 713/300, 713/320
See application file for complete search history.

(56) References Cited

U.S. PATENT DOCUMENTS

| | | | |
|---|---|---|---|
| 6,964,539 B2 | 11/2005 | Bradley et al. | |
| 6,985,952 B2 | 1/2006 | Bohrer et al. | |
| 7,003,640 B2 | 2/2006 | Mayo et al. | |
| 7,058,826 B2 * | 6/2006 | Fung | 713/300 |
| 7,197,433 B2 * | 3/2007 | Patel et al. | 702/188 |
| 7,213,065 B2 | 5/2007 | Watt | |
| 7,272,735 B2 | 9/2007 | Fung | |
| 7,278,273 B1 | 10/2007 | Whitted et al. | |
| 7,308,687 B2 | 12/2007 | Trossman et al. | |
| 7,325,050 B2 * | 1/2008 | O'Connor et al. | 709/223 |
| 7,667,986 B2 * | 2/2010 | Artusi et al. | 363/16 |
| 7,739,388 B2 * | 6/2010 | Wood | 709/226 |
| 7,756,972 B2 * | 7/2010 | Ma | 709/224 |
| 2003/0069953 A1 | 4/2003 | Bottom et al. | |
| 2007/0050644 A1 * | 3/2007 | Merkin | 713/300 |
| 2007/0192406 A1 | 8/2007 | Frietsch et al. | |
| 2007/0208799 A1 | 9/2007 | Hughes | |
| 2007/0209782 A1 | 9/2007 | Wyatt et al. | |
| 2008/0234873 A1 * | 9/2008 | Gorbatov et al. | 700/291 |
| 2009/0187782 A1 * | 7/2009 | Greene et al. | 713/340 |

OTHER PUBLICATIONS

"Creating an Energy-Efficient Datacenter," Sun Microsystems, Inc., available at <<http://www.sun.com/aboutsun/environment/docs/creating_energy_efficient_dchw_consolidation.pdf>>, accessed on Feb. 24, 2008, 4 pages.
"The Energy Efficient Data Center," Cisco Systems, Inc., available at << http://www.cisco.com/en/US/solutions/ns708/networking_solutions_products_genericcontent0900aecd806fd493. html>>, accessed on Jan. 14, 2008, 1 page.
"Facility Considerations for the Data Center, Version 2.0," Cisco Systems, Inc., available at << http://www.cisco.com/en/US/solutions/ns708/networking_solutions_products_genericcontent0900aecd806fd331.pdf>>, 2005, 24 pages.
"Product and Energy Use," Fujitsu Siemens Computers, available at <<http://www.ddcchallenge.co.uk/prodandener.html?TB_iframe=true&height=530&width=700, accessed on Jan. 14, 2008, 3 pages.

(Continued)

*Primary Examiner* — Nitin C Patel

(57) ABSTRACT

An illustrative power-efficient data center is described for operating in an uncontrolled environment in one scenario. The data center includes an air moving system that applies unconditioned air to resource items. The resource items are stripped down to provide a substantially minimum set of components for performing the data center'core functions. Various illustrative techniques for managing a power-efficient data center are also described.

13 Claims, 15 Drawing Sheets

OTHER PUBLICATIONS

"James Cropper Boosts Business Resilience with IBM System x and Triangle," available at << http://www-01.ibm.com/software/success/cssdb.nsf/CS/STRD-6WADS7?OpenDocument&Site=eserverxseries&cty=en_us>>, Dec. 8, 2006, 3 pages.

Mark Fontecchio, "Fears of cooling with outside air may be unfounded," Dec. 4, 2006, available at <<http://hightech.lbl.gov/media/Techtarget-4Dec06.pdf>>, 4 pages.

"Sun Modular Datacenter S20," Sun Microsystems, Inc., available at << http://www.sun.com/products/sunmd/s20/index.jsp>>, accessed on Feb. 24, 2008, 2 pages.

U.S. Appl. No. 12/060,875, filed Apr. 2, 2008, Belady, et al.

* cited by examiner

POWER-EFFICIENT STATE SETTING OF DATA-CENTER ELEMENTS

BACKGROUND

A data center refers to processing functionality for performing one or more prescribed processing tasks. In one common application, for example, a provider may use a data center to implement any kind of network-accessible service (such as an Email service, search service, and so on). In some cases, the provider may use a specially designed computer room within a general purpose facility to implement the data center. For a particularly large-scale service, the provider may devote one or more separate facilities to implement the data center.

The provider commonly places a high priority on delivering a reliable service. To this end, the provider may design the data center to minimize the number of errors that affect the service. It is believed that the environment in which the data center operates may sometimes cause or contribute to data processing failures. Hence, the provider commonly designs the data center to operate in a tightly controlled environment. For example, the provider may design its data center to operate within prescribed temperature and humidity ranges. This goal can be accomplished using various types and combinations of cooling systems, such as Computer Room Air Conditioning (CRAC) systems, chillers, and so on. However, failures will still occur. To address these events, the provider may design the data center to allow an administrator to locate and replace failed components and also perform regular maintenance.

A provider faces various challenges in designing a data center. One such challenge pertains to the cost of initially constructing and periodically upgrading the data center. This cost includes building structure costs, cooling system costs, processing functionality costs, and so on. Another challenge relates to the cost of operating the data center. A significant aspect of operating cost relates to the power required to run the data center facility. This cost has two components. A first component relates to the cost of running the processing functionality used to deliver the service. A second component relates to the cost of running all other functions performed by the data center, such as cooling, lighting, and so forth. The overall efficiency of the data center is defined by the ratio of the total power consumed by the data center to the power consumed by the processing functionality. The parameter is referred to as the Power Usage Effectiveness (PUE). For example, some data centers operate with a PUE of approximately 2 or higher; others have somewhat better performance. Other operating costs of a traditional data center relate to manual activities, such as the costs involved in identifying and replacing failed components.

As to power-related costs, the power consumed by data processing equipment has increased over time. However, the sophistication of the equipment has likewise increased. As a result, the overall performance per unit of energy consumption of some equipment has increased over time. On the other hand, the power consumed by other infrastructure functions continues to rise.

SUMMARY

An illustrative power-efficient data center is described that includes one or more resource items. The data center operates in an uncontrolled environment with reduced safeguards against failure. For example, in one case, the data center can include an air moving system that is configured to receive unconditioned ambient air that is external to the data center and supply the ambient air to the data center's resource item(s).

According to another illustrative feature, each resource item may include a group of data processing modules. The data processing modules can be constructed to have substantially minimal components to perform core functions of the data processing modules. For example, each of the data processing modules may eliminate the use of individual local fans, chassis structure, at least some power conditioning functionality, and so on. This feature substantially reduces the costs of the data processing modules and also makes the data processing modules more readily expendable.

According to another illustrative feature, substantially all of the power supplied to the power-efficient data center is used by the resource item(s) of the data center.

According to another illustrative feature, various techniques for managing a power efficient data center are described. As will be set forth in Section B of the ensuing description, the data center can be generically considered to include a plurality of part items, where each part item includes a plurality of subpart items. One management approach entails decommissioning a part item if it exhibits unsatisfactory performance (e.g., as reflected by its health), rather than servicing it. Decommissioning here may entail leaving the failed part item in the data center as is (and optionally powering it off). Or an administrator may eventually choose to exchange one or more failed part items with counterpart replacement item(s) in wholesale fashion, rather than servicing the individual subpart items within the failed part item.

Another illustrative management approach entails assessing the respective performances (e.g., efficiencies) of plural part items in the data center to provide a plurality of respective performance results. The approach then entails selecting, based on the performance results and based on an assessed processing demand, respective operating states in which the plurality of part items are to operate at a given point in time. In one illustrative case, the states can include at least an active state associated with a first state of part item availability, a standby state associated with a second state of part item availability, and/or an inactive state associated with a third state of part item availability. The technique then entails operating the part items in the states that have been selected. This approach has the effect of packing tasks onto the best-performing part item(s) (such as the most efficient part item(s)) to meet the assessed processing demand.

This Summary is provided to introduce a selection of concepts in a simplified form; the concepts are further described below in the Detailed Description. This Summary is not intended to identify key features or essential features of the claimed subject matter, nor is it intended to be used to limit the scope of the claimed subject matter.

The same numbers are used throughout the disclosure and figures to reference like components and features. Series 100 numbers refer to features originally found in FIG. 1, series 200 numbers refer to features originally found in FIG. 2, series 300 numbers refer to features originally found in FIG. 3, and so on.

DETAILED DESCRIPTION

This disclosure describes a power-efficient data center and various techniques for managing the data center. The concepts disclosed herein may address one or more of the challenges or problems previously noted, but are not limited to addressing all or any of these challenges or problems.

Section A describes illustrative features of various power-efficient data centers. Section B describes illustrative techniques for operating data centers. The techniques used to operate data centers can be applied to any type of data center; in other words, these techniques are not limited to application to the data centers described in Section A. Similarly, the data centers described in Section A can be managed by other techniques besides those described in Section B. Section C describes illustrative data processing functionality that can be used to implement any aspect of the data centers, systems, and techniques of Sections A and B.

This Application is related to commonly-assigned application Serial No. 12/060,875, entitled "Power-Efficient Data Center," filed on the same date herewith, naming the inventors of Christian L. Belady, James R. Hamilton, and Sean M. James.

A. Illustrative Data Centers

A.1. Illustrative Data Center with at Least One Resource Item

Figure 1:
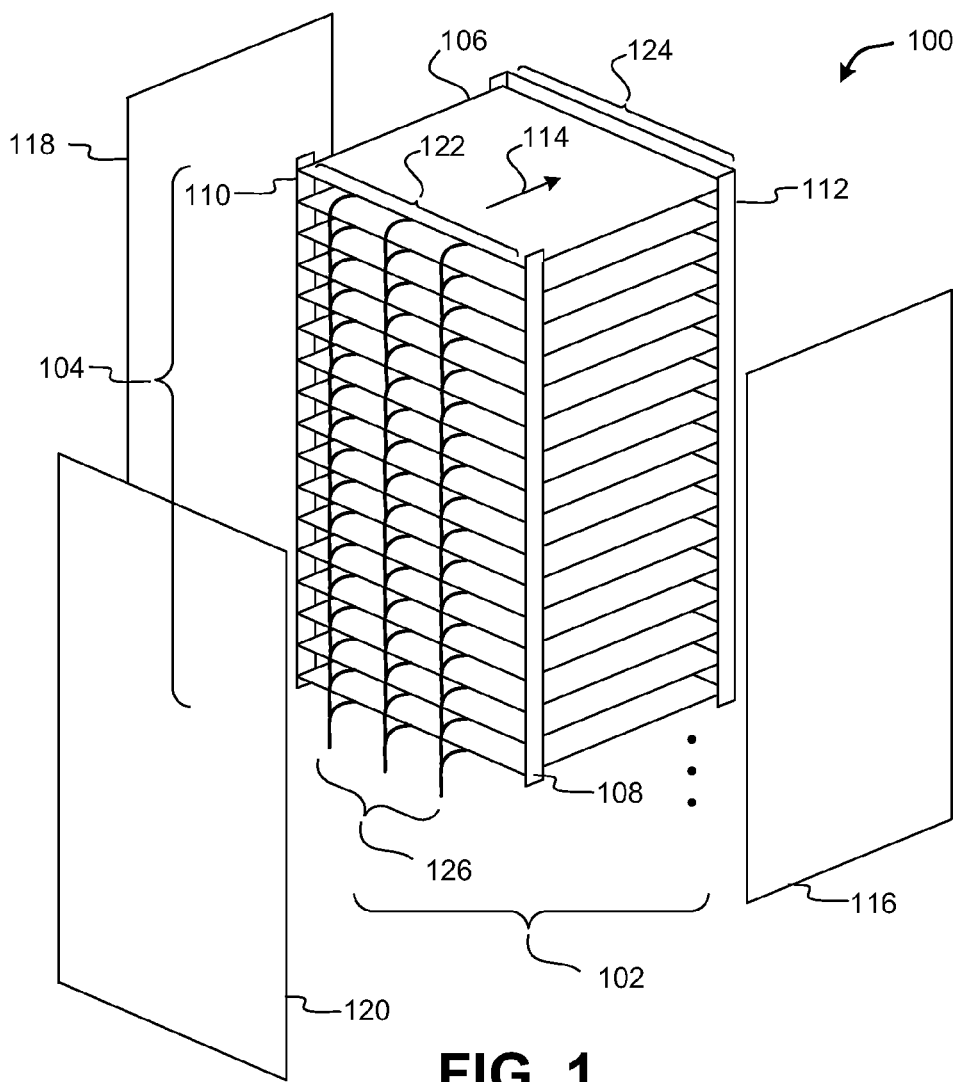
FIG. 1 shows an illustrative data center including a single resource item, wherein the single resource item, in turn, includes a collection of data processing modules.

FIG. 1 shows an illustrative data center 100. The data center 100 can be used to perform any data processing function or functions. In one illustrative case, the data center 100 can be used to provide one or more network-accessible services to electronic devices (e.g., personal computers, personal digital assistants, mobile telephones, etc.). In this application, the data center 100 can provide server-related functions.

The data center 100 in FIG. 1 includes a single resource item 102 (although, as set forth in later sections, the data center 100 can also include additional resource items). In this particular illustrative case, the resource item 102 includes a group of data processing modules 104, including representative data processing module 106. The particular number of data processing modules 104 shown in FIG. 1 is representative; in other implementations, the resource item 102 can include additional or fewer number of data processing modules 104. Further, FIG. 1 shows that the resource item 102 includes a vertical arrangement of the data processing modules 104. But other implementations can arrange the data processing modules 104 in other ways, such as a horizontal series of modules.

In one illustrative implementation, the data processing modules 104 can be constructed as processing boards, and the resource item 102 can comprise a stack of such processing boards. A housing structure can be used to support the stack of data processing modules 104. Any type of housing structure can be used. FIG. 1 shows an illustrative housing structure that includes two forward posts (108, 110) and a back support member 112. The housing structure can support the data processing modules 104 using any type of mechanism or combination of mechanisms. In one example, the housing structure can include slots or rails or other type of guiding mechanisms (not shown) that allow the data processing modules 104 to slide into the housing structure in the direction of arrow 114. When fully inserted, the data processing modules 104 can mate with the back support member 112; for instance, the data processing modules 104 may engage receiving slots or other type of guiding mechanisms (not shown) in the back support member 112. Alternatively, or in addition, the data processing modules 104 can be more securely fastened to the housing structure (e.g., using bolts or other fasteners).

In addition, the resource item 102 can optionally include one or more panels, such as side panel 116, side panel 118, and front panel 120. The panels (116, 118, 120) can be constructed of any material or materials. The front panel 120 and back support member 112 permit the flow of air through their surfaces (e.g., by including slot-type openings, perforations, or the like). The side panels (116, 118) may likewise permit the flow of air through their surfaces. Further, the panels (116, 118, 120) and back support member 112 may include filtering mechanisms to reduce the amount of dust and other containments that reach the data processing modules 104. Further, the panels (116, 118, 120) and back support member 112 may include EMI/EMC (electromagnetic interference and electromagnetic compatibility) mechanisms to control the amount of electromagnetic radiation that impacts the resource item 102 and/or which is emitted by the resource item 102 itself.

In one case, the resource item 102 is designed such that air flows laterally over the surface of the data processing modules 104 in the direction of arrow 114, upon which it passes out through the back support member 112. Hence, the front side of the resource item 102 is referred to as an air-intake portion 122, while the back side of the resource item 102 is referred to as an air-output portion 124. The data processing modules 104 can optionally include individual local fans (not shown) on the data processing modules 104 to assist in the movement of air from the air-intake portion 122 to the air-output portion 124. Alternatively, or in addition, the data center 100 can include a central fan or fans (not shown) to move air from the air-intake portion 122 to the air-output portion 124. These central fans serve as air movers for all of the data processing modules 104; hence, when these central fans are used, the data processing modules 104 may optionally omit the use of individual local fans. But in another case, the data center 100 can include multiple tiers of fans, such as both central fans and local fans. Later figures will illustrate the use of such central fans. In general, any mechanism used by the data center 100 to move air over the data processing modules 104 is referred to herein as an air moving system.

The resource item 102 can receive input and output signals and power using various connection mechanisms. In one case, input-output cabling 126 can connect to the data processing modules 104 via the air-intake portion 122 of the resource item 102. This arrangement makes the input-output cabling 126 more easy to access; further, since the input-output cabling 126 is located on the colder side of the resource item 102, it is potentially subject to less degradation (than if it was positioned on a hotter side of the resource item 102). However, the data processing modules 104 can alternatively receive the input-output cabling 126 on any other side, or on more than one side. FIG. 1 shows that the input-output cabling 126 comprises plural connections (e.g., in this example, three connections), but the resource item 102 can provide any number of connections to the data processing modules 104 (e.g., to suit the unique application-specific requirements of the data processing modules 104). The data processing modules 104 can receive power through any side or sides of the resource item 102, such as via the back support member 112. For instance, in one example, the data processing modules 104 can engage with slots (not shown) in the back support member 112. These slots can include power connections that deliver power to the respective data processing modules 104. This mechanism therefore can provide a blind-mated power connection. The resource item 102 can also accommodate other types of connections to receive other types of signals.

Figure 2:
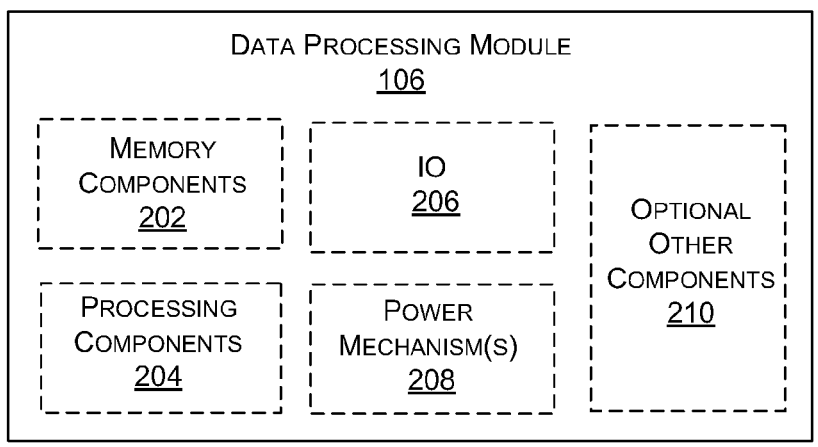
FIG. 2 shows the illustrative composition of a data processing module that can be used in the resource item of FIG. 1, or in some other environment.

FIG. 2 shows, in high-level form, components that can be used to compose an illustrative data processing module, such as the data processing module 106 shown in FIG. 1. The data processing module 106 can perform any function or combination of functions. In one case, the data processing module 106 performs a server-related role (or any combination of server-related roles) in connection with providing one or more network-accessible services to electronic devices (not shown) operated by users. For example, the data processing module 106 can implement a web site (or other network-accessible content), an electronic mail service, transaction processing functionality, and so on, or any combination of such services. The data processing module 106 can perform this role by itself or in combination with one or more other data processing modules.

In one case, the data processing module 106 can include one or more memory components 202, one or more data processing components 204 (such as one or more central processing units), an input-output (IO) mechanisms 206, and one or more power mechanisms 208 for supplying power to the data processing module 106. The high-level depiction shown in FIG. 2 is representative; other data processing modules can include additional components, or can omit one or more of the components shown in FIG. 2. For instance, FIG. 2 shows that the data processing module 106 includes a generically labeled collection of components referred to as "optional other components" 210. In addition, or alternatively, the data processing module 106 can omit any one or more of the memory components 202, data processing components 204, input-output (IO) mechanisms 206, power mechanisms 208, etc.

Referring now to both FIGS. 1 and 2, various types of strategies can be used to operate the data center 100. According to one illustrative strategy, the data center 100 is operated in an uncontrolled environment. In this environment, the air moving system of the data center 100 receives ambient air that is external to the data center 100 and passes this air over the surface of the data processing modules 104 in an unconditioned form. The terms "uncontrolled" and "unconditioned" mean that no attempt is made to cool the air or affect its humidity. The air moving system merely transfers ambient air from the air-intake portion 122 to the air-output portion 124 of the resource item 102 in the direction of arrow 114. In general, the term "ambient air" refers to whatever air happens to be external to the resource item 102 for receipt at the air-intake portion 122; this air could be either conditioned or unconditioned.

In one case, the data center 100 can be placed in an outdoor environment. For instance, the data center 100 can be placed within an enclosure that does not provide air conditioning, such as a tent, car port, garage, shed, trailer, shipping container, and so on. Or the data center 100 can alternatively be placed in the outdoor environment without the protection of a shelter or with the protection of a minimal shelter (e.g., a tarp covering the data center 100, etc.). In these cases, the ambient air received at the air-intake portion 122 of the data center 100 is not conditioned in any manner; it is "outdoor air." In an alternative case, the data center 100 can be placed in a temperature-controlled indoor setting. In this case, the ambient air may be conditioned by whatever air conditioning system that is provided by the indoor setting; however, in this case, at least the data center 100 itself does not perform any conditioning on the air that it receives from its ambient environment. In other words, while the data center 100 is placed in a controlled environment, it does not itself provide that environment. However, in another case, the data center 100 can include one or more cooling systems that do reduce the temperature of the ambient air and/or affect its humidity.

In those cases in which the data center 100 is operated in an uncontrolled environment, there is a possibility that its data processing modules 104 may fail at a greater rate than a data center that provides a tightly controlled environment. According to one illustrative approach, this potential consequence is accepted. The response to such an event may be to essentially refrain from responding to such an event.

For instance, suppose that a data processing module has failed. In one strategy, no attempt is made to service this module. This strategy implies that the data processing modules 104 are non-serviceable components. The failed data processing module is treated, by default, as de facto decommissioned. Optionally, the data center 100 can also manage the data processing modules 104 such that a non-failed data processing module takes over the role performed by the failed data processing module.

At some point, the resource item 102 as a whole may completely fail. Or the performance of the resource item 102 as a whole may drop below a prescribed threshold (as will be discussed more fully in Section B). One way of addressing this scenario is by replacing the entire existing resource item 102 with another resource item (not shown). Or suppose that, in a variation, the data center 100 includes more than one resource item. In this case, the failure of the resource item 102 can be addressed by decommissioning the failed resource item (or group of failed resource items) in the manner explained above, that is, by effectively taking no action with respect to the failed resource item(s) (other than optionally removing the power from the failed resource item or items). An administrator may eventually decide to replace the failed resource item 102 (or a group of failed resource items); the timing at which the administrator does so may be governed by various application-specific considerations.

One consequence of the above-described strategy is that the data center 100 can omit a cooling system which conditions the air. That is, the data center 100 can omit traditional Computer Room Air Conditioning (CRAC) systems, chillers, and so on. This allows the data center 100 to potentially significantly reduce the power costs associated with running the data center 100. However, in another case, the data center 100 can include one or more cooling systems that do reduce the temperature of the ambient air and/or affect its humidity.

Another potential consequence of the above-described strategy is that substantially all of the power that is used to run the data center 100 is used to power its Information Technology (IT) load; in this case, the IT load of the resource item 102 is mainly the power required to run the data processing modules 104. This means that the data center 100 operates with a Power Usage Efficiency (PUE) value of approximately 1. More generally, in one illustrative environment, the PUE may be in the range of approximately 1.0 to approximately 1.2. In another illustrative environment, the PUE may be in the range of approximately 1.0 to approximately 1.6. This general power-related characteristic of the data center 100 applies to many of the implementations of the concepts described herein; however, other implementations provide combinations of features which are not limited to the above-described power-related characteristic.

Another consequence of the above-described strategy is that the data center 100 can reduce the amount of manual effort required to maintain the data center 100, and the costs associated therewith; this is because, as stated, many failures are left unattended. As will be described immediately below, the non-serviceability of the data processing modules 104 (and possibly the resource item 102 as a whole) can be made more attractive by making these components to be low cost and expendable. This approach also simplifies the maintenance of the data center 100. For instance, this approach may entail replacing functionality on the resource item level (or larger), rather than the data processing module level. Since changes are made in larger "chunks," this approach makes it easier to keep track of changes made within the data center 100. Alternatively, as stated above, another strategy is to leave the failed components in place (that is, without replacing the failed components); this may be appropriate in those cases in which data center real estate is ample enough to accommodate the continued presence of failed components. The failed components can optionally be powered off to reduce power consumption.

One way of complementing the above-described strategy is by designing the data processing modules 104 as one-use expendable items. For instance, in one case, the data processing modules 104 can be constructed as "stripped down" items. More formally stated, each data processing module can include a substantially minimal set of components that are used to perform its core tasks. For example, consider the case in which the data processing modules 104 deliver a network-accessible service to users. The core tasks of this application pertain to the execution of the service itself—whatever is minimally being used to deliver the functions expected by the end-users.

From a structural perspective, the data processing modules 104 can be built as substantially bare boards, e.g., by eliminating sheet metal and other structural members that are not being used for minimal structure integrity of the data processing modules 104. More simply stated, the data processing modules 104 can entirely or substantially omit chassis structure or other structural members to reduce costs.

From a device perspective, the data processing modules 104 can omit various components that are not directly related to the delivery of its core functions. For example, the data processing modules 104 can omit individual local fans, hot-swapping mechanisms, diagnostic and maintenance functionality, various types of media devices, and so on. The data processing modules 104 may also provide simplified power conditioning functionality. In one case, the data center 100 can supply power to the data processing modules 104 that does not require any type of transformation (voltage level transformation, AC to DC transformation, etc.), or which requires relatively minimal transformation. This allows the data processing modules 104 to omit or simplify the processing functionality devoted to power transformation to thereby reduce costs.

Different applications and services may use different components; thus, the list of the components that are "not core components" may vary for differing applications.

A.2. Illustrative Data Center Unit

Figure 3:
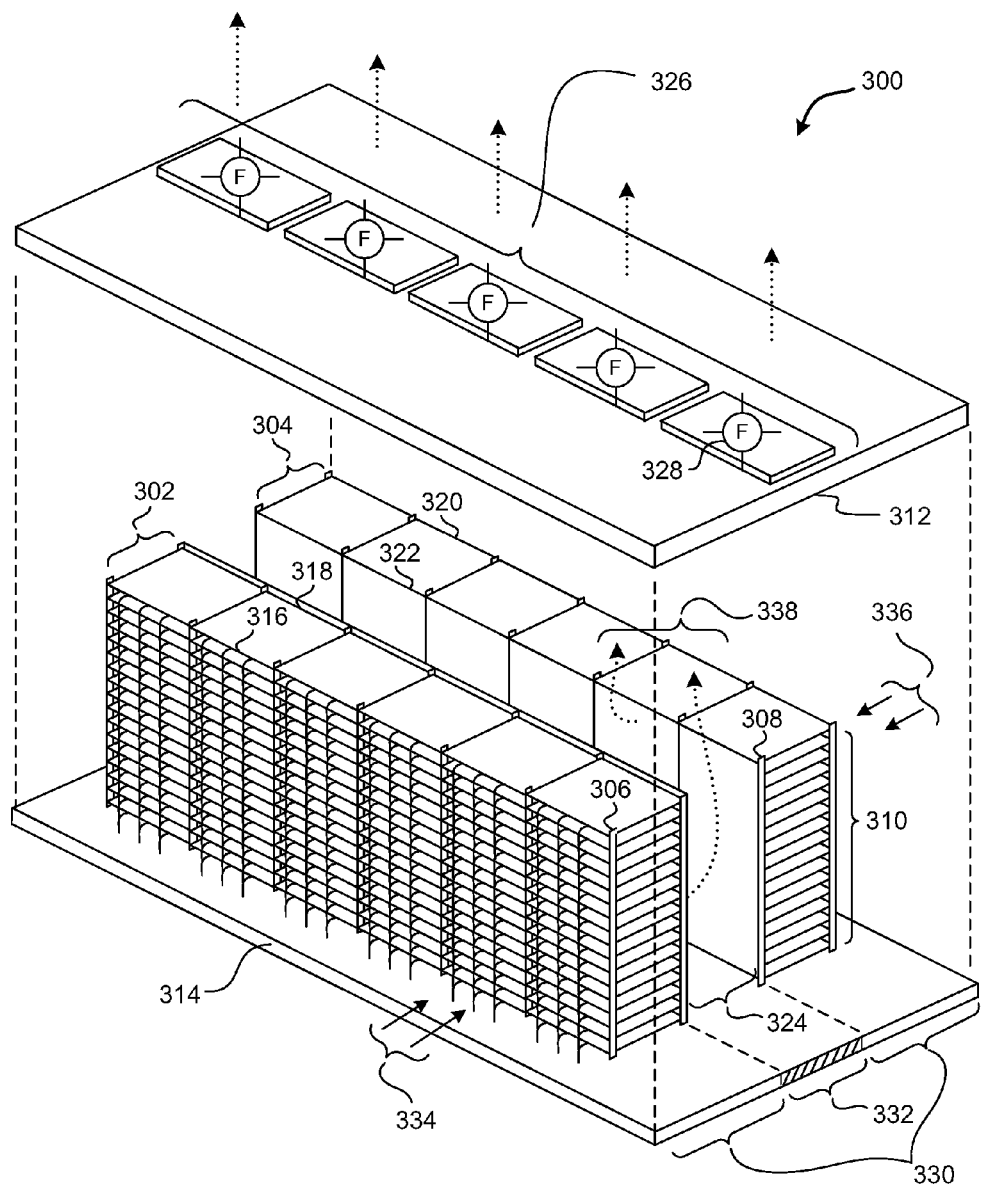
FIG. 3 shows another illustrative data center that can be built using resource items of the type shown in FIG. 1, or some other type or combination of types.

The data center 100 of FIG. 1 includes a single resource item 102. But data centers can be built with plural resource items. For instance, FIG. 3 shows one such data center 300 that includes plural resource items. In turn, even larger data centers can be constructed using the data center 300 shown in FIG. 3 (or using some other type of data center having multiple resource items). Subsequent figures illustrate representative types of such larger data centers. In the context of the discussion of those later figures, the data center 300 is referred to as a "data center unit." This is because the data center 300 forms the basic unit from which larger data centers can be constructed.

Turning attention now to the details of the data center 300 of FIG. 3, this data center 300 includes two arrangements (e.g., rows) of resource items. Namely, a first arrangement 302 (e.g., row) includes a set of resource items in side-by-side relation. Likewise, a second arrangement 304 (e.g., row) includes another set of resource items in side-by-side relation.

Resource item 306 is a representative resource item in the first arrangement 302 of resource items. Resource item 308 is a representative resource item in the second arrangement 304 of resource items. The resource items (e.g., resource items 306, 308, etc.) in the data center 300 can have the same construction as the resource item 102 of the data center 100 of FIG. 1. Alternatively, the resource items in the data center 300 can differ from the previously-discussed resource item 102 in any respect. Further, the data center 300 can include a combination of different types of resource items.

Assuming that the previously-discussed resource item 102 is used to construct the data center 300, each individual resource item includes a group of data processing modules. For instance, FIG. 3 shows that resource item 308 includes a group of data processing modules 310. Each resource item includes a structure that stacks the data processing modules in vertical relation, horizontal relation, or some other relation (or combination of relations). In one case, each resource item receives input and output signals through its air-intake portion side (to be discussed) or through any other side(s). Each resource item can receive power through its back support member or through any other side(s). Any power connection mechanism or combination of mechanisms can be used, such as a cable-type plug-in connection, a blind-mated connection, and so on. Each resource item can optionally include panels (not shown). If used, the front panel and the back support member can permit the flow of air through their respective surfaces (e.g., by providing slot-like openings, perforations, etc.).

Figure 4:
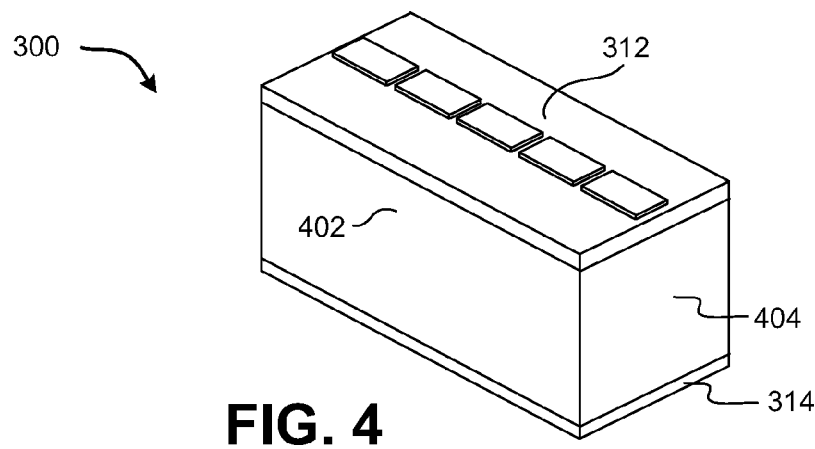
FIG. 4 is a three-dimensional depiction of the data center of FIG. 3, showing its external appearance.

The data center 300 can include a ceiling member 312 and a floor member 314. The ceiling member 312 and the floor member 314 can be constructed of any material or materials (such as metal, etc.). The data center 300 is illustrated in FIG. 3 with the ceiling member 312 lifted off the top of the resource items to show the internal features of the data center 300. The data center 300 may also include side wall members; these members are omitted from FIG. 3, but are shown in FIG. 4 (to be discussed).

The resource items in the first arrangement 302 include an air-intake side referred to as an air-intake portion 316 and an air-output side referred to as an air out-output portion 318. Similarly, the resource items in the second arrangement 304 include an air-intake side referred to as an air-intake portion 320 and an air-output side referred to as an air-output portion 322. With reference to the first arrangement 302, air flows into the air-intake portion 316 from the ambient external environment. The air then passes over the surfaces of the data processing modules in the first arrangement 302, where it is heated by the elevated temperatures of those data processing modules. The air then passes out through the air-output portion 318. The airflow of the second arrangement 304 follows the same path as the first arrangement 302; namely, the air passes in through the air-intake portion 320 and out of the air-output portion 322. The ambient air that is received by the air-intake portions (316, 320) can be either unconditioned or conditioned. The former case may correspond to a scenario in which the data center 300 is placed in an outdoor environment; the latter case may correspond to a scenario in which the data center 300 is placed in a conditioned indoor environment or a scenario in which the data center 300 receives conditioned air in some other way. (And this description applies to all of the data centers set forth herein.)

The air-output portion 318 of the first arrangement 302 laterally faces the air-output portion 322 of the second arrangement 304. A gap 324 forms an aisle that separates the first arrangement 302 from the second arrangement 304. Because heated air is directed into the gap 324, the gap 324 can also be referred to as a hot aisle. In one case, the hot aisle can be sealed (meaning that it does not readily permit human entry); in another case, the hot aisle is not sealed.

The ceiling member 312 can include one or more central fans 326, including representative central fan 328. These central fans 326 can represent any type or combination of types of fans. In one case, the central fans 326 are vertically disposed over the gap 324 between the first arrangement 302 and the second arrangement 304. This allows the central fans 326 to suck the heated air from the gap 324 and pass it to the external environment or some other destination (and, in the process, also draw in cooler ambient air at the air-intake portions from the ambient environment). The central fans 326 thus act as central air movers for all of the data processing modules in the data center 300. This enables the data processing modules to optionally omit the use of individual fans on their respective processing boards. However, in other cases, the data processing modules (or some subset thereof) can include supplemental individual fans.

This positioning of the central fans 326 shown in FIG. 3 is merely illustrative; in other cases, central fans can be placed in other locations within the data center 300. For example, the ceiling member 312 can include only central fan 328 located at the distal end of the ceiling member 312. In this case, ductwork (not shown) that spans the longitudinal length of the ceiling member 312 can carry heated air from the gap 324 to the central fan 328, whereupon the central fan 328 removes the heated air from the data center 300. Still other air movement strategies can be used.

The floor member 314 can include a first portion 330 that permits ambient air underneath the data center 300 to reach the data processing modules (e.g., by using a grated floor member or members, a perforated floor member or members, etc.). The floor member 314 can include a second portion 332 which does not permit air to pass through it. The reason for blocking the flow of air through the second portion 332 is to increase the draw of air over the surfaces of the data processing modules.

In summary, FIG. 3 shows arrows to illustrate the representative flow of air through the data center 300. Ambient air (334, 336) passes from the external environment into the air-intake portions (316, 320) of the arrangements (302, 304). The air passes over the surfaces of the data processing modules, whereupon it becomes heated. Heated air 338 passes into the gap 324; there, the heated air 338 sucked out of the data center 300 by the central fans 326. Note that solid air flow arrows denote cooler air and the dotted air flow arrows denote heated air. These are relative terms; all that is implied is that the air moving into the data center 300 is cooler than air that is expelled from the data center 300.

As mentioned above, the data center 300 may be placed in an outdoor environment or an indoor environment. In the case of an outdoor setting, the air supplied to the data center 300 is not conditioned. In the case of an indoor setting, the air supplied to the data center 300 may be conditioned by whatever system is employed by the indoor environment. But in both cases, the data center 300 itself does not employ an air conditioning system which processes the ambient air (e.g., by cooling it or altering its humidity). As described above, this potentially permits the data center 300 to substantially reduce the power costs associated with running the data center 300. The air moving system of the data center 300 may be considered to be the central fans 326. These central fans 326 move the air through the data center 300, but do not otherwise refrigerate the air or alter its humidity. However, in another case, the data center 300 can include one or more cooling systems that do reduce the temperature of the ambient air and/or affect its humidity.

The data center 300 can also include other cost-saving features described above in connection with FIG. 1. For instance, the data center 300 can be designed such that failing components are de facto decommissioned, rather than serviced. For example, no attempt is made to service failed (or failing) data processing modules. If a data processing module fails, it can be decommissioned; another non-failed data processing module can optionally take over the role performed by the failed data processing module. If a resource item fails to provide satisfactory performance, the resource item can be similarly de facto decommissioned. An administrator may choose to eventually replace a resource item or a group of resource items. To complement the above-described non-servicing strategy, the data center 300 can be constructed using the above-described low cost resource items (e.g., "stripped down" resource items).

The above-described approach helps reduce maintenance and troubleshooting costs (since processing functionality is being replaced in large block units, rather than on the level of individual processing modules). Also, this strategy allows the data center administrator to more readily keep track of updates made to the data center 300.

FIG. 4 shows a three-dimensional external depiction of the data center 300 of FIG. 3. Here, the ceiling member 312 is put in place. Further, side wall members (402, 404) are placed on the sides of the data center 300. (The two sides that are not visible in FIG. 4 include similar side wall members). The side wall member 402 (and its counterpart on the other side of the data center 300) permit the flow of air through their surfaces (e.g., via slots-like openings, perforations, etc.). Note that the ceiling member 312 and the side wall members (402, 404) are optional; the data center 300 can also be used without these components. When used, any of the side wall members (402, 404), ceiling member 312, and floor member 314, etc. can include filtering mechanisms, EMI/EMC mechanisms, and so on.

When used, the side wall members (402, 404) can optionally be removed to allow access to the resource items. For instance, the side wall members (402, 404) may be attached to the data center 300 using sliders, hinges, removable fasteners (screws, etc.), and so on. Alternatively, or in addition, sufficient space may separate the side wall members (402, 404) from the cold air-intake portions (316, 320) of the arrangements (302, 304) to create accessible aisles; the user may gain entry to these aisles via a door or doors in the side wall member 404 or the like (not shown).

Figure 5:
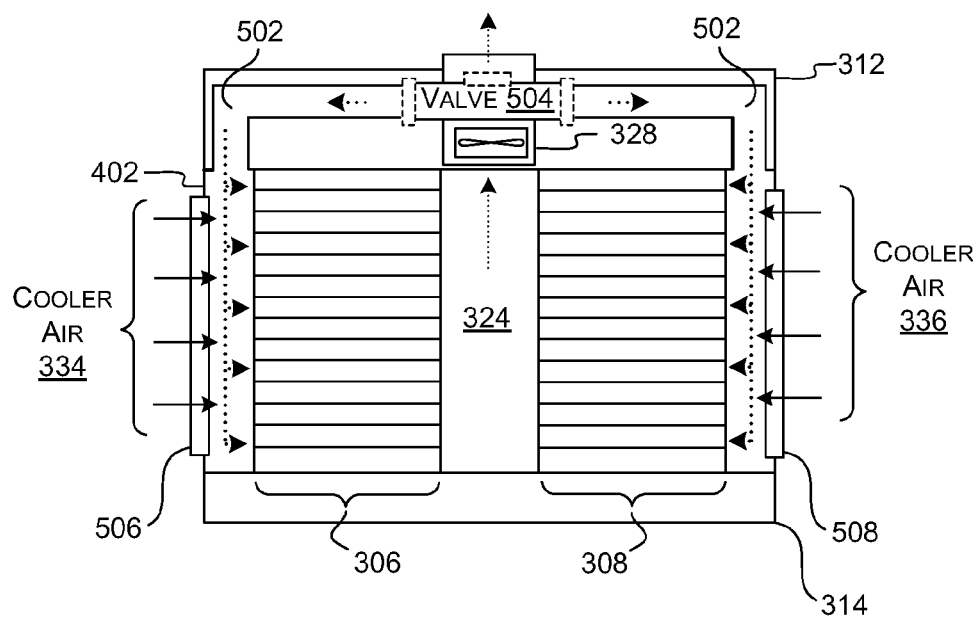
FIG. 5 shows an air moving system that may be used for the data center of FIG. 3.

FIG. 5 describes a venting system that can be used redirect heated air from the gap 324 back into the data center 300. This operation may be desirable in scenarios in which the data center is operated in relatively cold environments (where the extent of the low temperatures may negatively affect the processing functions performed by the data center 300). By redirecting the flow of heated air back into the data center 300, the venting system can heat the data center 300 based on the heat generated by the data processing modules. The venting system is considered part of the above-described air moving system.

FIG. 5 corresponds to a cross section of FIG. 3. It shows resource item 306 (which is a member of first arrangement 302) and resource item 308 (which is a member of arrangement item 304). The gap 324 separates the resource item 306 from the resource item 308. The ceiling member 312 caps the top of the data center 300. The floor member 314 is the substrate on which the resource items (306, 308) sit. Side wall members (e.g., side wall member 402) cover the sides of the data center 300.

Ductwork 502 provides a cavity which directs air from the ceiling member 312 to the air-intake portions (316, 320) of the data center 300. In other words, the ductwork 502 directs the air across the ceiling member 312 to the cold sides of the data center 300. At the air-intake portions (316, 320), the cooler air that is received from the external environment mixes with the heated air that has been redirected from the gap 324. This mixture of air elevates the temperature of the air that is received by the data processing modules of the data center 300. To repeat, this feature may be useful in those circumstances in which the data center 300 is operated in an environment in which the ambient air is cold enough to potentially negatively affect the performance of the resource items of the data center 300. The air that is supplied to the resource items is elevated using the heat generated by the resource items themselves.

The venting system can optionally include one or more first valves 504 that control the amount of heated air that is redirected to the sides of the data center 300. The venting system can also optionally include one or more second valves 506 that control the amount of cooler air that is passed to the first arrangement 302 from the external environment. The venting system can also optionally include one or more third valves 508 that control the amount of cooler air that is passed to the second arrangement 304 from the external environment. As stated above, the side wall members (e.g., 402, 404) can optionally include filter mechanisms, EMI/EMC mechanisms, etc.

There are many ways to re-circulate air that has been heated by the resource items; FIG. 5 corresponds to merely one illustrative implementation. For instance, another implementation can omit one or more of the valves (504, 506, 508) described above. Also, as will be described in the next section, a data center can include multiple data center units, where interstitial spaces separate neighboring data center units. In this case, the air moving system can redirect heated air into these interstitial spaces, thus affecting the temperature of the air that is supplied to the resource items. In these multi-unit scenarios, each data center unit can optionally omit individual side wall members (e.g., 402, 404) and associated side wall valves (e.g., 506, 508).

Figure 6:
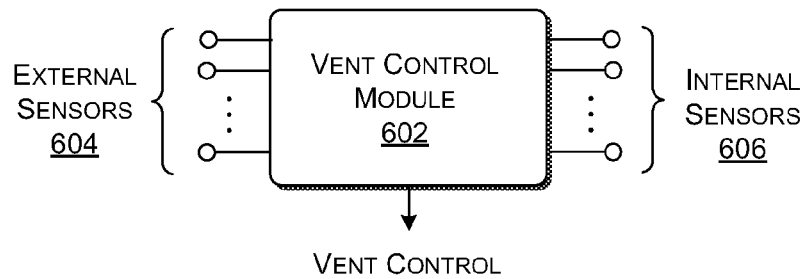
FIG. 6 shows a vent control module that can be used to control a venting system used in the air moving system of FIG. 5.

FIG. 6 shows a vent control module 602. The vent control module 602 can include external sensors 604 which monitor the temperature of the external environment and internal sensors 606 which monitor the temperature at various points inside the data center 300. The vent control module 602 processes these sensor inputs to generate valve control signals. The valve control signals control the operation of the valves (504, 506, 508). The valves (504, 506, 508) can also be controlled based on other considerations. For example, the valves (504, 506, 508) can be controlled such that sufficient draw exists to suck at least some cold air into the air-intake portions (316, 320) of the data center 300.

Figure 7:
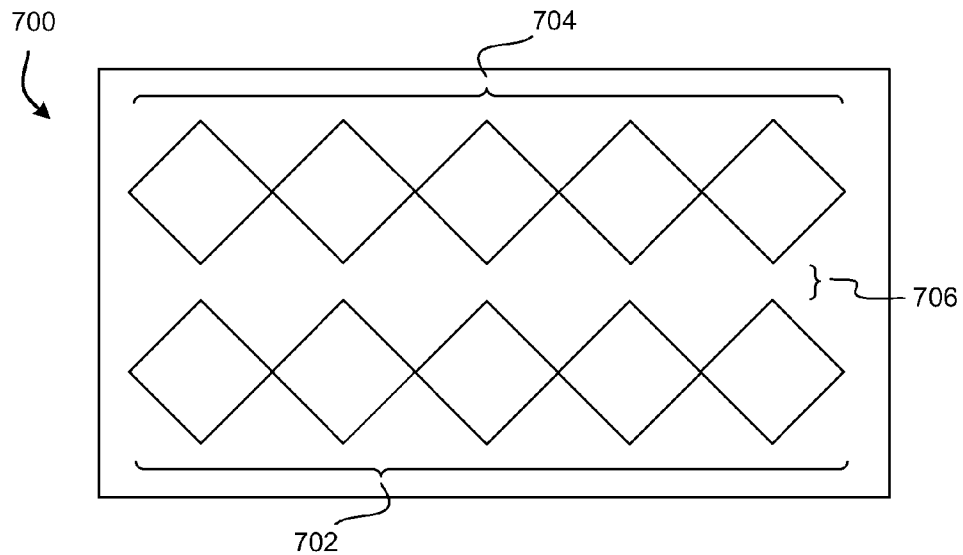
FIG. 7 shows a variant of the data center of FIG. 3; this data center includes a different arrangement of resource items compared to the data center of FIG. 3.

FIG. 7 shows an overhead view of another data center 700 (with its optional ceiling member removed). Like the previously discussed case, the data center 700 includes a first arrangement 702 of resource items and a second arrangement 704 of resource items. A gap 706 separates the first arrangement 702 from the second arrangement 704. But in the case of FIG. 7, the resource items are not placed in flush side-by-side arrangement. Rather, in FIG. 7, the resource items are rotated 45 degrees and the resource items are placed in corner-to-corner arrangement. The arrangement shown in FIG. 7 may allow additional air from the ambient environment to reach the data processing modules compared to the implementation of FIG. 3. This may be useful, for example, in those scenarios in which the back support members of the resource items include connection mechanisms which may at least partially obstruct the flow of air therethrough; in this case, additional air can flow through the sides of the data processing modules into the gap 706. The arrangement shown in FIG. 7 may also be easier to service compared to implementation of FIG. 3. Otherwise, the data center 700 shown in FIG. 7 operates in the manner described above with respect to FIGS. 3-6.

Figure 8:
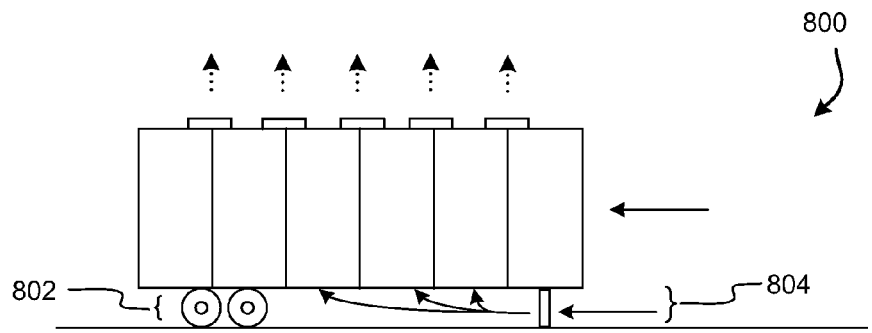
FIG. 8 shows a variant of the data center shown in FIG. 3; this data center includes wheels or other kinds of transportation mechanisms to render it more readily transportable.

FIG. 8 shows another data center 800 that is placed on a truck bed or the like having wheels 802. This feature allows the data enter 800 to be readily transported and quickly deployed to meet dynamically changing processing demands. For example, if a geographic region experiences a sudden need for processing functionality, the data center 800 can be easily transported to that location; when that need goes away, the data center 800 can be easily removed. The data center 800 can be transported by other mechanisms. For instance, the data center 800 can incorporate a floating base for transportation over water, skis for transportation over snow, and so on. The data center 800 can also be dropped by parachute or like mechanism to poorly accessible locations.

Other than being readily transportable, data center 800 functions in the manner described above. As an added feature, the data center 800 can also receive ambient air 804 from beneath the data center 800. The air passes through the floor member of the data center 800 to provide additional ambient air to its data processing modules. However, the portion of the floor member beneath the hot aisle gap (e.g., corresponding to second portion 332 in FIG. 3) may preclude the passage of air therethrough to increase the draw of cooler air over the surfaces of the data processing modules.

Figure 9:
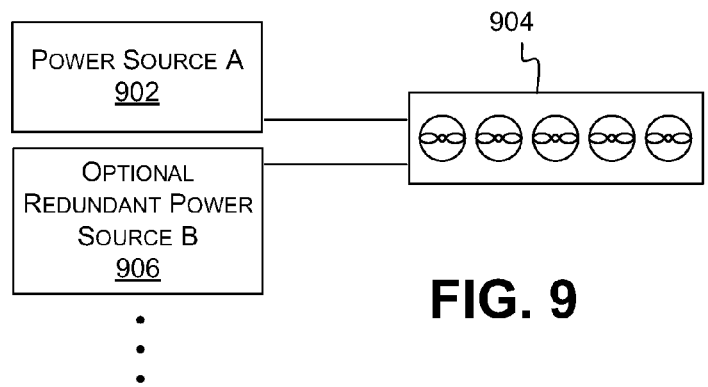
FIG. 9 shows power mechanisms that can be used to supply power to a data center.

Finally, FIG. 9 shows various strategies that can be used to supply power to any of the data centers described above (or any other data center). In one case, a single power source A 902 may used to power a representative data center 904. In another case, another power source B 906 can be used to provide redundant power to the data center 904 (where the redundant power source B 906 may act as either a standby power source or supplemental power source or both). Yet additional redundant power sources (not shown) can be used to power the data center 904. In one case, all of the power sources (e.g., 902, 906) applied to the data center 904 can be of the same type; in another case, different types of power sources can be applied to the data center 904. In one illustrative case, at least one of the power sources (e.g., 902, 906) can be local (that is, dedicated) with respect to the data center 904. Alternatively, or in addition, at least one of the power sources (e.g., 902, 906) can provide power to more than one data center.

Various types of power sources can be used to power the data center 904. A non-exhaustive list of such power sources includes: public utility power sources; turbine power sources; fuel cell power sources; wind-operated power sources; photovoltaic power sources; wave-operated power sources; nuclear power sources; geothermal power sources, and so on. The data center 904 can include appropriate functionality for conditioning the supplied power so that it is compatible with the native voltage requirements of the data processing module. However, in one case, it is desirable to reduce the complexity of the power conditioning functionality or omit it entirely. For instance, fuel cells and other power sources can be designed to provide native DC voltage to the power sources which requires no (or minimal) conditioning.

A.3. Illustrative Multi-Unit Data Centers

FIGS. 10-14 show additional data centers that can be constructed with multiple resource items. In these examples, the data centers are particularly constructed from "data center units"; the data center units, in turn, each include multiple resource items. Hence, the data centers in FIGS. 10-14 can be referred to as multi-unit data centers. For example, the data centers can be constructed using the data center 300 shown in FIG. 3 as a basic data center unit. Or the data centers can be constructed from any other types of data center unit or combination of data center units.

Figure 10:
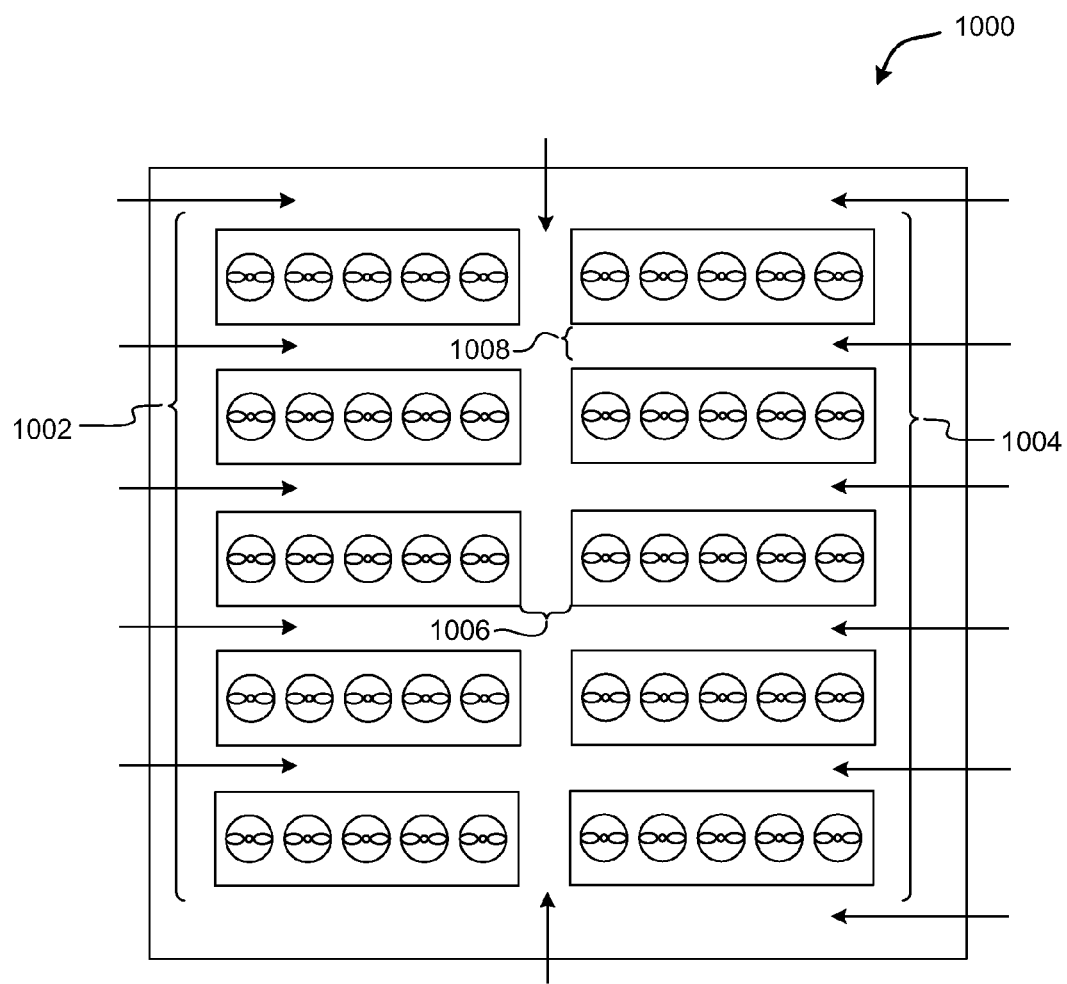
FIG. 10 shows another illustrative data center that includes a group of data center units arranged in a grid-like arrangement; in one implementation, the data center shown in FIG. 3 can be used to provide each data center unit.

Starting with FIG. 10, this figure shows an overhead view of a field of data center units, collectively comprising a data center 1000. As stated above, each data center unit includes a plurality of resource items. If the data center units are constructed in the manner described with respect to FIG. 3, each data center unit includes back-to-back arrangements (e.g., rows) of resource items with a gap separating the arrangements. Central fans can be disposed in the ceiling member to remove heated air from the gap. The circular symbols shown in FIG. 10 represent the central fans in the ceiling member.

In the case of FIG. 10, the data center 1000 arranges the data center units in a grid-like pattern. Namely, the data center 1000 includes a first column 1002 of data center units and a second column 1004 of data center units. A gap 1006 separates the first column 1002 of data center units from the second column 1004 of data center units. Inter-row gaps separate the rows of the data center 1000; one such representative inter-row gap is gap 1008. The arrangement of data center units shown in FIG. 10 is representative; other implementations can provide any number of rows and any number of columns of data center units. Further, the data center units need not be placed in symmetric parallel rows as shown; in some outdoor applications, the geography of the landscape may influence the placement of data center units.

Ambient unconditioned (or conditioned) air may pass through the gaps (e.g., gaps 1006 and 1008) between data center units. Ambient air can alternatively, or in addition, pass through an elevated floor member of the data center 1000. The air is then drawn into the data center units. The air then passes through the data center units, where it is heated by the data processing modules used by the data center units. Heated air exits through the central fans provided by the ceiling members. To prevent heated air from re-entering the data center units via the gaps (e.g., gaps 1006 and 1008), the data center 1000 can include a roof member (not shown). The roof member may preclude the passage of heated air into the gaps (e.g., gaps 1006 and 1008). The roof member includes openings to receive the heated air from the central fans of the data center units. The data center 1000 can also optionally include air-permeable side wall members (not shown) disposed around the outer perimeter of the data center 1000. The side wall members (and/or roof member and/or floor member) can optionally include filtering mechanisms used to filter the ambient air that is supplied to the data center units. Further, the side wall members (and/or roof member and/or floor member) can optionally include EMI/EMC mechanisms to control the amount of electromagnetic radiation that impacts the data center 1000 and/or which is emitted by the data center 1000 itself. The data center 1000 can optionally include a venting system similar to that shown in FIG. 5 for redirecting heated air back into the gaps (e.g., gaps 1006, 1008, etc.). The venting system can include any combination of: optional vents to redirect the heated air expelled by the ceiling fans; optional vents to restrict the amount of ambient air that is supplied to the data center units via the outer perimeter side wall members, and so on. The venting system may be appropriate for operation in environments in which temperatures drop below a prescribed threshold.

Figure 11:
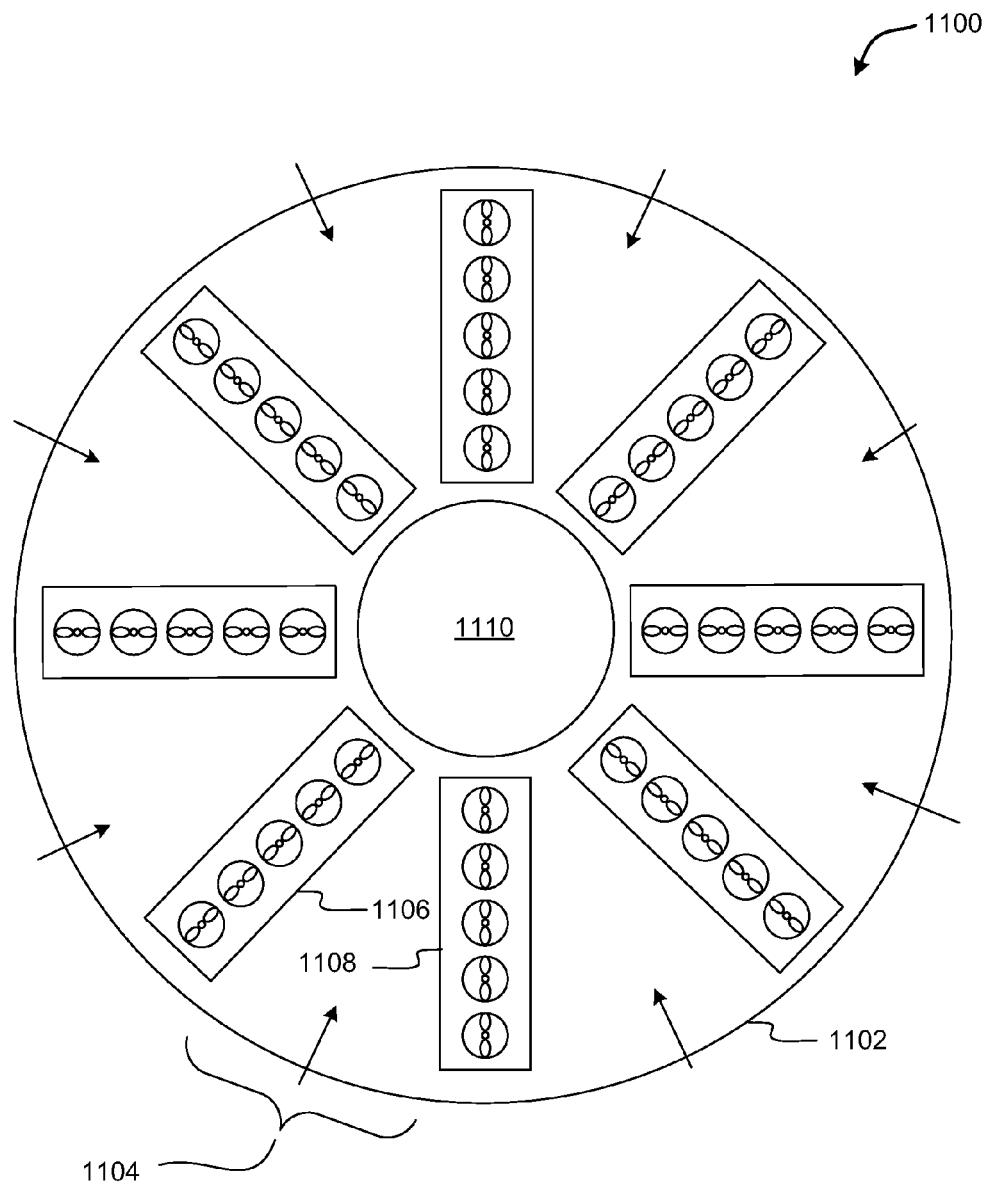
FIG. 11 shows another illustrative data center that includes a group of data center units arranged in a generally circular arrangement; in one implementation, the data center of FIG. 3 can be used to provide each data center unit.

FIG. 11 shows another data center 1100 that includes a pinwheel-shaped arrangement of data center units. In other words, the data center units are disposed like spokes in a wheel about a hub. Ambient unconditioned air passes through an outer surface 1102 of the data center 1100 into gaps between neighboring data center units. For example, air can pass into the representative gap 1104 between representative neighboring data center units 1106 and 1108. Ambient air can alternatively or additionally pass through an elevated floor member of the data center 1100. The ambient air can then enter the data center units in the manner described above and exit through the top of the data center units via the central fans in the ceiling members. The data center 1100 may also optionally include one or more of a roof member, filtering mechanisms, EMI/EMC mechanisms, venting system, etc., e.g., similar to that described above with respect to FIG. 10. The middle of the data center 1100 represents an optional common chimney 1110. The relevance of the common chimney 1110 will be described in the context of the next figure.

Figure 12:
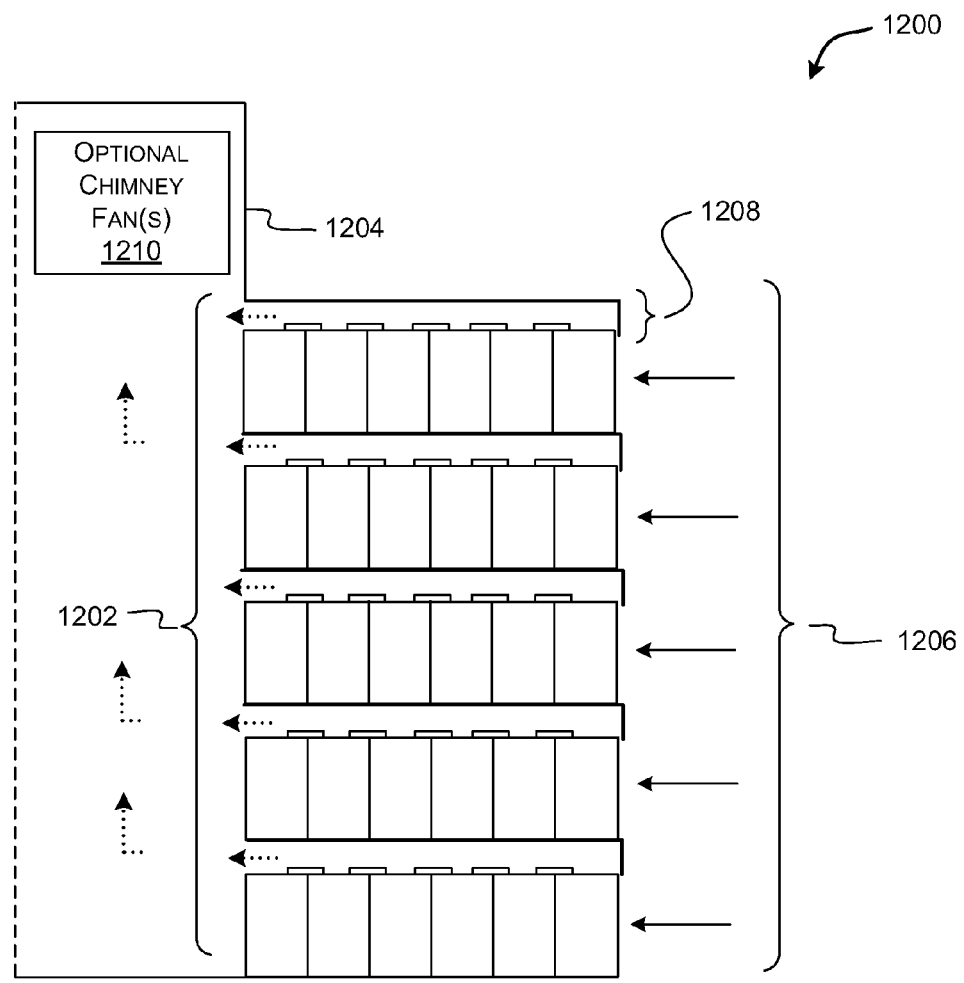
FIG. 12 is a cross-sectional view of another data center, showing how plural data center units can be stacked in a vertical arrangement.

FIG. 12 shows a cross section of another data center 1200 in which data center units are stacked in a vertical arrangement (whereas in FIGS. 10 and 11 the data center units are stacked in a horizontal side-by-side arrangement). In this particular case, the data center 1200 includes five stacked layers 1202 of data center units. The use of five stacked layers 1202 is merely representative; other data centers can include additional or few stacked layers of data center units. The data center 1200 also includes a central chimney 1204. In one case, the data center 1200 may supply some or all of it cabling to the data center units via the central chimney 1204 (e.g., input-output cabling, power cabling, etc.). In one implementation, FIG. 12 may show only half of the cross section of the data center 1200. In other words, FIG. 12 may omit from illustration a symmetric second half of the data center to the left of the dotted line.

Figure 13:
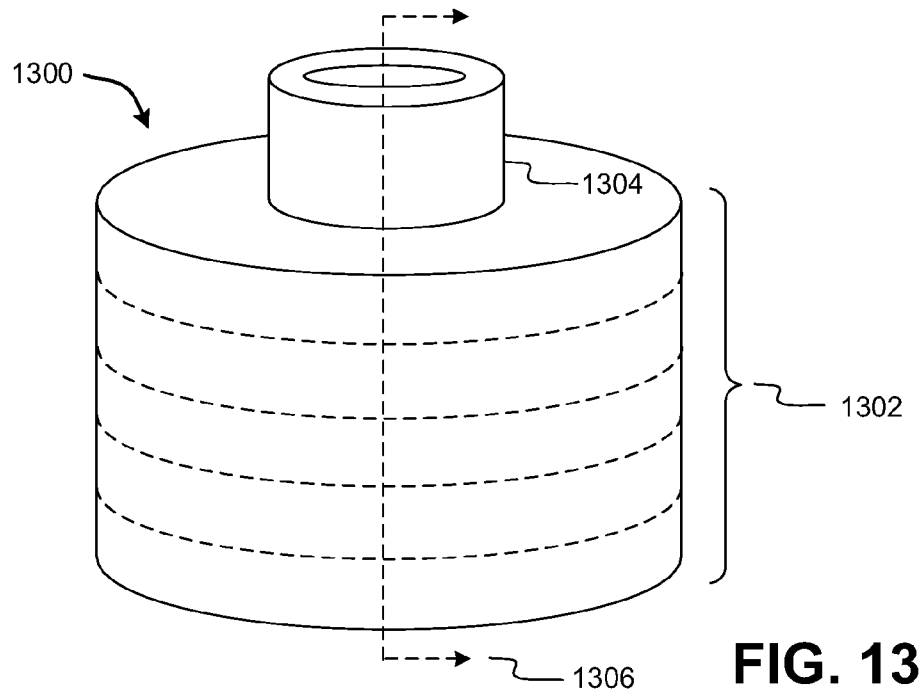
FIG. 13 is a three-dimensional depiction of a cylindrically-shaped data center; the cross section of this data center may correspond to the cross section shown in FIG. 12.
Figure 14:
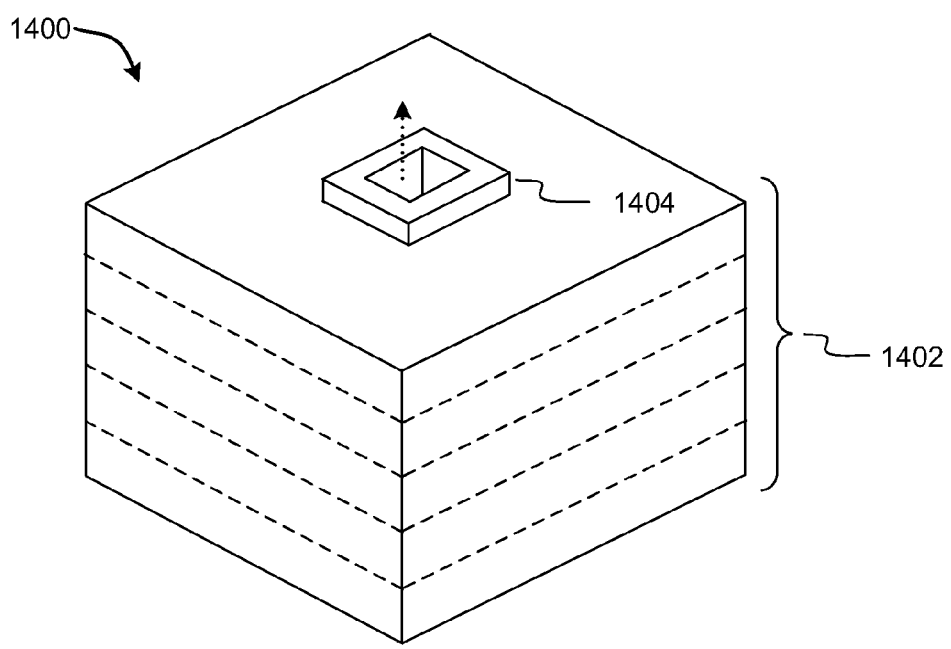
FIG. 14 is a three-dimensional depiction of a polygonal-shaped data center; the cross section of this data center may correspond to the cross section shown in FIG. 12.

The data center 1200 can be constructed to have any shape. In one case, the data center 1200 has a curved (e.g., circular) cross-sectional profile (as illustrated in FIG. 13). In another case, the data center 1200 can have a polygonal cross-sectional profile (as illustrated in FIG. 14). The data center 1200 may have yet some other cross-sectional profile. Assume for the purposes of discussion that the data center 1200 is a generally cylindrical structure which has a circular cross-sectional profile. In this case, a horizontal cross section taken across the top of any layer of data center units in FIG. 12 may correspond to the pinwheel arrangement shown in FIG. 11.

In this arrangement, ambient unconditioned air 1206 (represented by the arrows) can pass through the outer surface of the data center 1200 and enter the gaps between the data center units. The ambient air can then enter the data center units in the manner described above. Heated air passes out the top of the data center units via the central fans in the ceiling members. Ductwork can receive the air from the central fans and direct it to the central chimney 1204. FIG. 12 illustrates one representative duct 1208 which directs heated air from the topmost layer of data center units into the central chimney 1204.

Once the heated air reaches the central chimney 1204 it can be allowed to exit the central chimney 1204 in an unassisted manner (e.g., due to the natural dynamics of convection). In one example, the data center 1200 can optionally omit all fans by using a sufficiently tall central chimney 1204 in conjunction with appropriate power densities, thereby relying on the passive cooling provided by natural convection. Alternatively, the central chimney 1204 can include one or more chimney fans 1210 at its distal end to assist in the removal of the heated air from the central chimney 1204. In one case, the chimney fans 1210 may represent the only air moving fans in the entire data center 1200. In other words, the use of the chimney fans 1210 allows a designer to omit the use of central fans disposed on the ceilings of individual data central units and board fans disposed on individual data processing modules. In some applications, the use of a few larger (and slower-moving) fans may be more power-efficient than the use multiple smaller (and faster moving) fans. But in other cases, the data center 1200 can use multiple tiers of fans, including ceiling fans and/or local fans, and/or other kinds of fans. The central chimney 1204 may also include one or more turbines (not shown). The turbines may be moved by heated air as it exits the central chimney 1204. The turbines can be used, in turn, to supply supplemental power to the data center units.

As mentioned above, FIG. 13 shows a data center 1300 that is a cylindrically-shaped variant of the data center 1200 of FIG. 12. This data center 1300 includes five stacked layers 1302 of data center units and a central chimney 1304. (A dashed line 1306 represents a cross section that slices the data center 1300 through its center; half of this cross section corresponds to the depiction shown in FIG. 12.) The data center 1300 operates in the manner described above with respect to FIG. 12.

FIG. 14 shows a data center 1400 that is a polygonal-shaped variant of the data center 1200 of FIG. 12. This data center 1400 includes five stacked layers 1402 and a central chimney 1404. The data center units in this data center may be arranged in a grid-like pattern (similar to the case shown in FIG. 10), with the exception that the central chimney 1204 is positioned in the middle of the grid-like pattern. The data center 1400 operates in the manner described above with respect to FIG. 12.

Again, the vertically-stacked examples shown in FIGS. 13 and 14 are merely two of many possible examples. In another case, a data center (not shown) can stack plural columns of data center units. For example, consider the representative second column 1004 of data center units shown in FIG. 10. Plural of these columns can be stacked on top of each other to create a multi-unit data center. Instead of a common chimney, this kind of data center can receive intake air from one vertical face of the data center and expel output air from another vertical face (e.g., an opposite face) of the data center. Such a data center could be anchored to the side of a multi-story building for support.

Any type of data center described in this disclosure can supply heated air generated by the data processing modules to any kind of recipient entity that can utilize such heated air, such as a human-inhabitable building, a greenhouse, and so forth.

B. Illustrative Techniques for Managing Data Centers

B.1. System for Managing a Data Center

Figure 15:
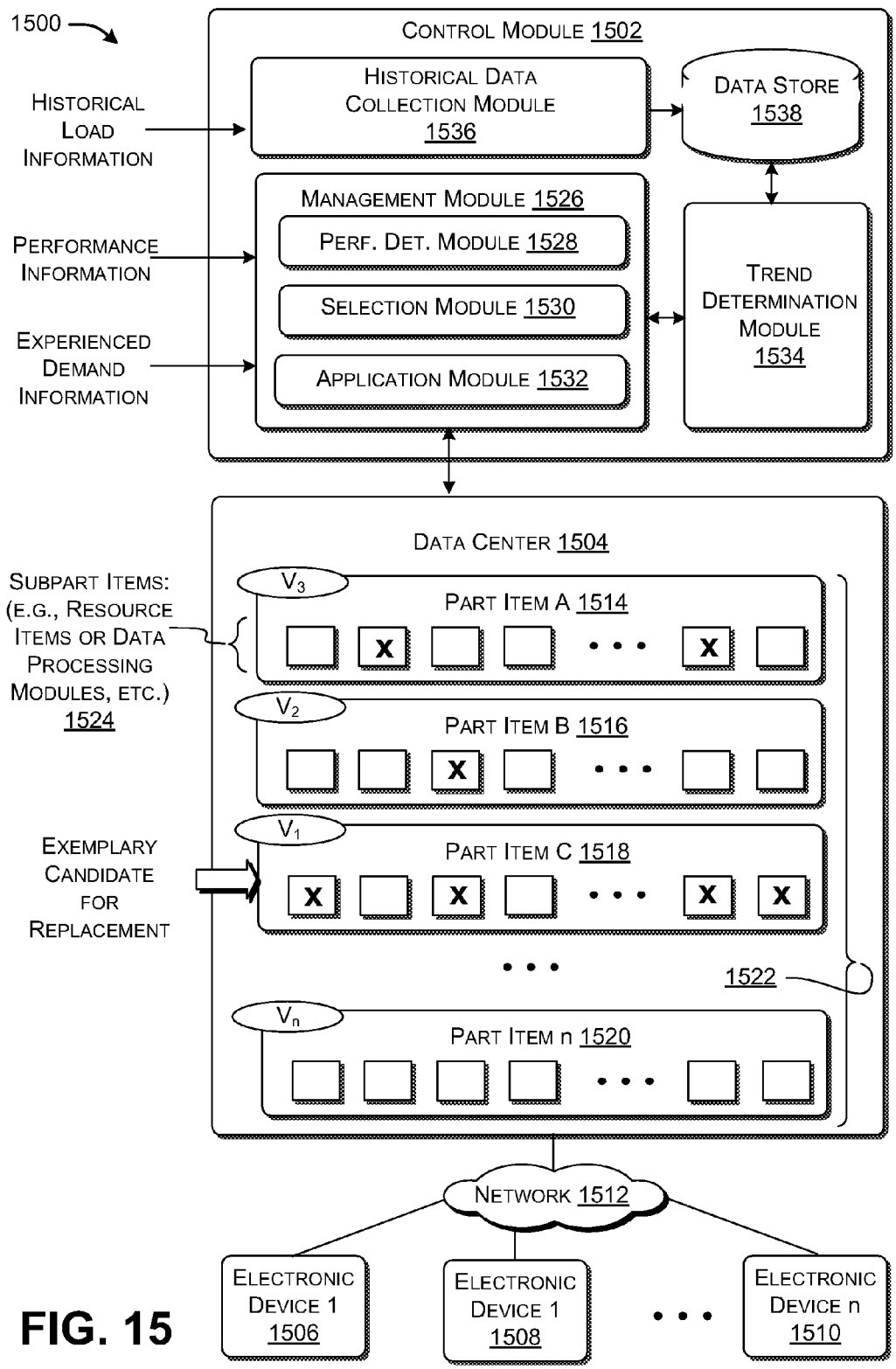
FIG. 15 shows an illustrative system for managing a data center; the data center can include a plurality of part items, and each part item can include a plurality subpart items.

By way of overview, FIG. 15 shows an illustrative system 1500 that includes at least one control module 1502 (e.g., one, two, three, etc. control modules) and at least one data center 1504 (e.g., one, two, three, etc. data centers). A plurality of electronic devices (1506, 1508, . . . 1510) can interact with the data center 1504 via a network 1512. Each of these components will be described in detail below.

Figure 23:
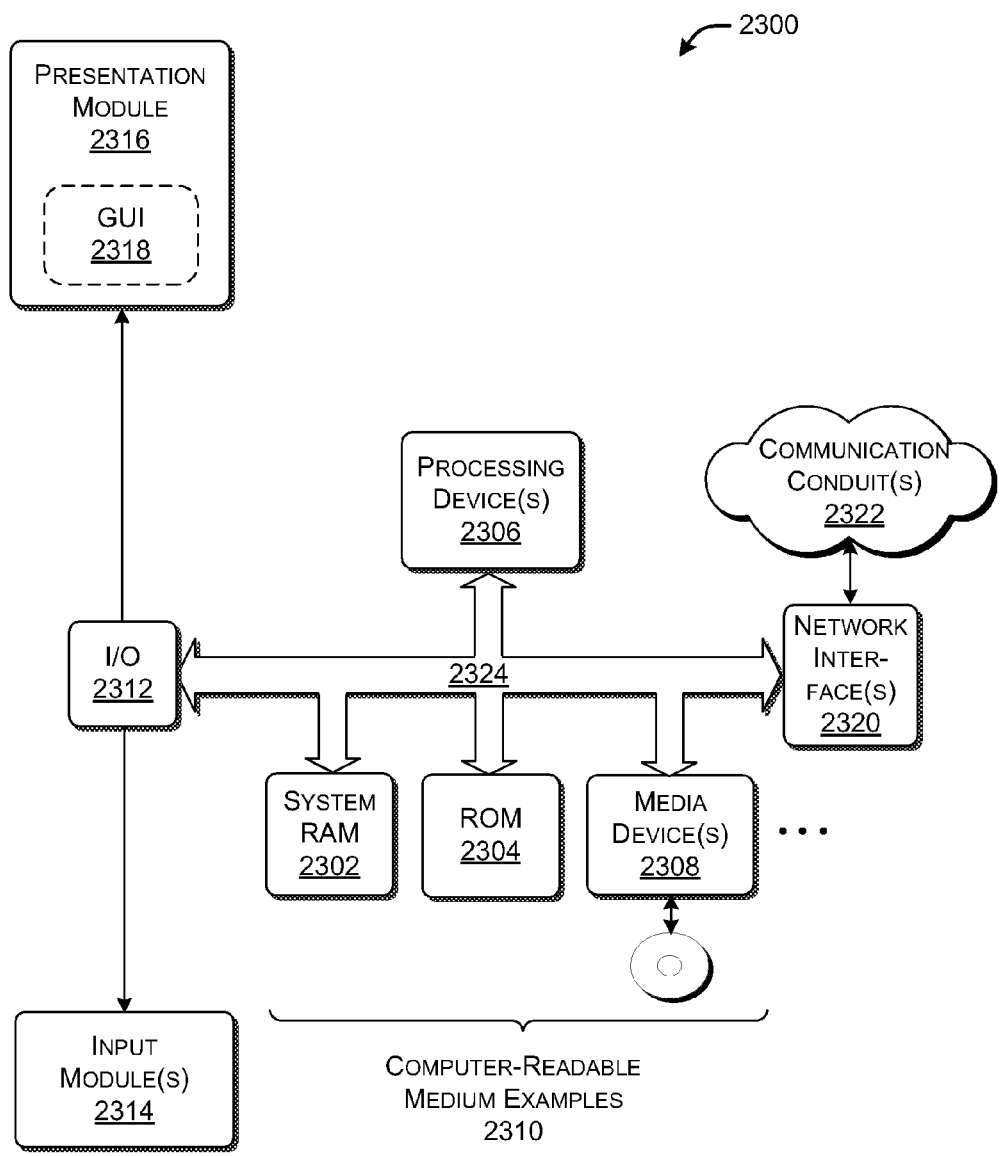
FIG. 23 shows illustrative processing functionality that can be used to implement various aspects illustrated in the preceding figures.

As a preliminary matter, the various components shown in FIG. 15 can be implemented in any manner, for example, by software, hardware, firmware, manual processing operations, and so on, or any combination of these implementations. The illustrated separation of various components in this figure into distinct units may reflect an actual physical grouping and allocation of distinct physical components; alternatively, the separation of any two or more components may reflect different functions performed by a single physical component. For instance, in one example, the various modules illustrated in the control module 1502 can be implemented by a single application program running on one or more computer devices, where that application program performs distinct tasks associated with respective modules. FIG. 23, to be discussed in turn, provides additional details regarding one illustrative implementation of the functions shown in FIG. 15.

The data center 1504 can correspond to any type of data processing infrastructure. In one case, the data center 1504 can correspond to any one or more of the data centers discussed in Section A. In another case, the data center 1504 can correspond to any other type of data center or combination of types of data centers. Further, the data center 1504 can be implemented by equipment provided at a single facility or by equipment distributed over plural facilities.

The data center 1504 includes one or more part items. FIG. 15 particularly corresponds to an illustrative case in which the data center 1504 includes part items A-n (1514, 1516, 1518, . . . 1520). These part items (1514, 1516, 1518, . . . 1520) are collectively referred to as a group of part items 1522 for brevity. Each part item, in turn, can include a plurality of subpart items. For example, part item A 1514 includes a plurality of subpart items 1524.

The terms "part item" and "subpart item" are intended to have broad scope as used herein. These terms can map to the concepts disclosed in part A in various ways. In one case, the data center 1504 is a multi-unit data center, such as, but not limited to, any of the multi-unit data centers described in Section A.3. In this case, a part item can correspond to a data center unit, such as, but not limited to, the data center 300 shown in FIG. 3. In this case, the subpart items can correspond to individual resource items within the data center 300. In another case, a part item can correspond to an individual resource item, such as, but not limited to, the resource item 102 shown in FIG. 1. In this case, the subpart items can correspond to individual data processing modules 104. In yet another case, the part items can correspond to individual data processing modules, such as, but not limited to, the individual data processing modules 104 shown in FIG. 1. In another case, the control module 1502 can control the data center 1504 on plural different levels of granularity, e.g., data center unit level, resource item level, data processing module level, etc. Still other implementations of the concepts "part item" and "subpart item" are possible. In other implementations, the terms "part item" and "subpart item" can correspond to data center components other than those described in Section A.

In the manner described in Section A, an administrator can optionally update the data center 1504 by replacing one or more part items 1522, rather than attempting to locate and replace individual subpart items within the part items 1522. Thus, in one example, the minimal unit of replacement in the data center 1504 is the part item, not the subpart item. Now consider that, as technology evolves, an administrator may choose to update a failed part item with a replacement part item that includes an updated version of the processing technology provided by the failed part item. As a result of this strategy, different part items 1522 in the data center may embody different versions of processing technology. For example, part item 1514 uses version V3 of the processing technology, part item 1516 uses version V2 of the processing technology, part item 1518 uses version V1 of the processing technology, and so forth. By virtue of this approach, an administrator can more easily keep track of the versions of processing technologies used by the data center 1504 (e.g., as opposed for pinpointing a particular subpart item within a vast collection of such subpart items).

The data center 1504 can provide any service or combination of services to the electronic devices (1506, 1508, . . . 1510). To name just a few examples, the part items may provide server-related functionality for providing an on-line Email service, a search service, a banking service, a social networking service, and so on. Alternatively, or in addition, the data center 1504 can provide any type of service for internal use by any type organization, such as a governmental institution, corporation, and so on.

The electronic devices (1506, 1508, . . . 1510) can correspond to any type of electronic components for interacting with the data center 1504. For example, the representative electronic device 1506 can correspond to any type of computer device (e.g., personal computer, laptop computer, etc.), personal digital assistant (PDA), mobile telephone, and so on.

The network 1512 may represent any type of mechanism for allowing the electronic devices (1506, 1508, . . . 1510) to interact with the data center 1506. The network 1512 can correspond to a wide area network (such as the Internet), a local area network (LAN), a point-to-point connection, or any combination of connectivity mechanisms. The network 1512 can be physically implemented using any combination of hardwired links, wireless links, name servers, gateways, routers, and so on (not shown). The network 1512 can be governed by any protocol or combination of protocols.

Now turning to the control module 1502, this functionality can be local and/or remote with respect to data center 1504. For example, the control module 1502 can be located in the same facility as the data center 1504 and/or can be located at one or more remote locations with respect to the data center 1504. In the case in which the control module 1502 is local with respect to the data center 1504, in one example, the control module 1502 can be implemented by one or more of the part items 1522 or some component(s) thereof. For example, the control module 1502 can be implemented as one or more servers provided by one or more data center units. In the case in which the control module 1502 is remote with respect to the data center 1504, the control module 1502 can be connected to the data center 1504 using any type of connection mechanism, such as a WAN connection, LAN connection, point-to-point connection, etc., or any combination thereof. In the case in which the control module 1502 is provided at more than one location, this implementation can be used to provide distributed and/or redundant control functionality.

The control module 1502 includes a management module 1526 for managing the operation of the part items 1522 in the data center 1504. The management module 1526, in turn, includes a number of component modules: a performance determination module 1528; a selection module 1530; and an application module 1532.

The performance determination module 1528 determines the performance of each of the part items 1522 in the data center 1504. The performance determination module 1528 can use any type of parameter (or combination of parameters) to gauge the performance of a part item. In one case, the performance determination module 1528 can estimate the performance of a part item based on the version of the processing technology that it uses. This approach is based on the assumption that a more recent version of the technology will have better performance than a less recent version. In another case, the performance determination module 1528 estimates the performance of a part item as a percentage of subpart items that have failed within the part item (or which exhibit unsatisfactory performance). In another case, the performance determination module 1528 estimates the performance of a part item as the efficiency of the part item, e.g., as the amount of work performed by the part item per unit of energy expenditure (e.g., per watt). Still other performance parameters (and combinations of parameters) can be used to gauge the performance of the part items 1522, such as the age of the part items 1522, the power consumed by the part items 1522, and so on. In some cases, a performance parameter may generally track one or more other performance parameters. For example, version information (associated with age) in some cases may act as a proxy for measured performance parameters, such as efficiency parameters, health parameters, etc. In any case, FIG. 15 shows that the performance determination module 1528 receives performance information from the data center 1504; it uses this performance information to determine the performance of the part items 1522. The performance determination module 1528 outputs performance results associated with respective part items 1522.

The selection module 1530 uses the performance results, in possible combination with other information, to select one or more part items 1522 on which some action is to be performed. More specifically, the management module 1526 can use different approaches to manage the data center 1504, wherein each approach can rely on a different kind of performance parameter or combination of performance parameters.

In one management approach (to be described further below with respect to FIG. 17), the selection module 1530 selects part items 1522 to be decommissioned or replaced. It can perform this function by comparing the performance of a part item (as reflected by the performance results) to a threshold. In one example, one kind of performance result that can be used may reflect the health of a part item. The health of a part item, in turn, may correspond to the percentage of its subparts which have failed. If the performance of the part item falls below such a threshold (e.g., in one merely illustrative case, 40%), then the selection module 1530 identifies this part item as a candidate for decommissioning or replacement. In the example of FIG. 15, the part item 1518 may be a candidate for decommissioning or replacement because many of its subpart items (e.g., resource items in one case, etc.) have failed (or are performing poorly), as reflected by the "x's" which graphically mark the faulty subpart items.

In one case, the application module 1532 (to be discussed below) can decommission the selected part item, e.g., by expressly de-activating it (e.g., by removing power to it and considering it henceforth as an unusable resource). This operation helps reduce the power consumed by the data center 1504. The application module 1532 also can optionally reallocate the functions performed by this failed part item to another more efficient part item using virtualization and migration tools, such as, but not limited to, Microsoft® Corporation's Virtual Server (provided by Microsoft® Corporation of Redmond, Wash.), VMware, Inc.'s VMware products (provided by VMware, Inc. of Palo Alto, Calif.), and so on. Alternatively, or in addition, an administrator can manually replace a part item that has been selected by the selection module 1530.

In another management approach (to be described further below with respect to FIG. 18), the selection module 1530 uses the performance results to allocate different part items 1522 to handle processing demand. In one case, for instance, the selection module 1530 investigates either (or both) the actual experienced demand or a forecast demand, and then selects one or more part items to be operated in an active state to handle this demand. As the name suggests, part items operated in an active state are immediately available to handle the processing demand with little or no setup time. For instance, these part items may include powered-up servers that are running the appropriate application(s) to immediately handle the processing demand. The selection module 1530 can optionally select one or more other part items to be operated in a standby state to handle any processing demand that cannot be met by the active part items. Part items operated in a standby state are available to handle processing demand with relatively little setup time, but are not as quickly available as the active part items. For example, the standby part items may include powered-up servers that are not yet running the appropriate application(s), but can be relatively quickly set up to perform the appropriate application(s). In other words, the standby part items effectively provide a buffer in case processing demand cannot be met using the active part items. Further, the selection module 1530 can optionally select one or more other part items to be operated in an inactive state to handle any processing demand that cannot be met by either the active part items or the standby part items. Part items operated in an inactive state are available to handle processing demand after they have been activated, which may require a significant amount of time compared to the active part items and the standby part items. Although three states (active, standby, and inactive) have been described herein, the selection module 1530 can alternatively select among more than three states or few than three states. For instance, a low power state can be used that corresponds to a state of readiness between the standby state and the inactive state. Part items operated in the low power state are available to meet processing demand that cannot be met by the active part items and standby part items, e.g., after the low power part items have been fully powered up and other potential setup tasks have been performed.

Stated in another way, the selection module 1530 assigns states to part items 1522 based on assessed processing demand and the respective performances of the part items 1522. In this case, the performance results can reflect the respective efficiencies of the part items 1522, such as the amount of work performed by the part items 1522 per unit of energy expenditure. Assume that, in one example, the data center 1504 includes part items having different respective efficiencies. The selection module 1530 may use the performance results to select the most efficient part item(s) for operation in the active state, the next most efficient part item(s) for operation in the standby state, the next most efficient part item(s) for operation in the inactive state, and so forth. As such, the selection module 1530 may have the effect of packing or allocating processing tasks on the most efficient part items. The selection module 1530 can call on less efficient part items (operated in other states) as need arises, e.g., to handle peak processing demand experienced by the data center 1504. Moreover, note that inactive (and potentially less efficient) part items can be powered off, thus facilitating the conservation of power in the data center 1504.

As indicated above, the selection module 1530 may have the effect of assigning different operating states to part items having different respective efficiencies (depending on the processing demand). For instance, to meet a particular processing demand at a given time, the selection module 1530 can assign part items having version V3 to serve as active part items, and part items having version V2 to serve as standby part items. However, this is merely one example. In another example, a data center may include enough best-efficient part items so that, for instance, all of the active part items and standby part items needed to meet a particular processing demand can be implemented using the best-efficient part items, e.g., say, version V3 part items.

In order to perform its functions, the selection module 1530 receives experienced demand information from the data center 1504. This information reflects the prevailing actual demand being placed on the part items 1522. The selection module 1530 also receives trend information from a trend determination module 1534 (to be discussed below). The trend information reflects the processing demand that is forecast to be placed on the part items 1522.

The application module 1532 executes whatever action has been selected by the selection module 1530. In the first above-described management approach, the application module 1532 can automatically decommission one or more part items that exhibit performance (e.g., health) below a prescribed threshold. As noted above, the application module 1532 can also automatically transfer the functions performed by a failed part item to one or more non-failed part items. But in other cases, no action is taken to, in effect, de facto commission a part item (other than optionally turning the part item off to conserve power in the data center 1504). In the second above-described management approach, the application module 1532 can maintain the part items 1522 in various states identified by the selection module 1530 based on the performances (e.g., efficiencies) of the part items 1522 and the assessed processing demand. For example, the application module 1532 can maintain one or more part items in an active state, one or more part items in a standby state, one or more part items in an inactive state, and so on. The application module 1532 can perform these operations by commanding various part items to operate in the selected states. The application module 1532 can also optionally transfer the functions performed by one part item to another part item so that the recipient of the functions is able to perform its ascribed tasks. This operation may entail transferring program code among devices using virtualization and migration tools (examples of which were cited above).

The management module 1526 is described above as performing either the first management approach or the second management approach. But the management module 1526 can also perform both the first management approach and the second management approach, and/or yet some other management approach(es).

The trend determination module 1534 operates to estimate the processing demand that will be placed on the data center 1504. The trend determination module 1534 can perform this task based on historical load information. The historical load information reflects the processing demands that have been experienced by the data center 1504 over a prescribed prior period of time. The historical load information may also identify various factors associated with the experienced load, such as whether a certain spike corresponds to a holiday or other special event. The trend determination module 1534 can use any functionality to compute trend information. In one example, the trend determination module 1534 can compute the demand likely to be placed on the data center in the month of January by averaging the demand experienced by the data center 1504 over prior months of January in past years.

To facilitate the collection of historical load information, the control module 1502 also can include a historical data collection module 1536 and a data store 1538. The historical data collection module 1536 represents any functionality for collecting prior processing demand information. The historical data collection module 1536 may receive this information from the data center 1504 itself in optional conjunction with other sources. For example, the historical data collection module 1536 may also mine information provided by other data centers (if this information is made available) under the assumption that the load experienced by those other data centers is correlated with the load experienced by the data center 1504. The data store 1538 can represent any repository or collection of repositories for storing information, such as one or more databases managed by any type of database management functionality.

B.2. Illustrative Manner of Operation

Figure 16:
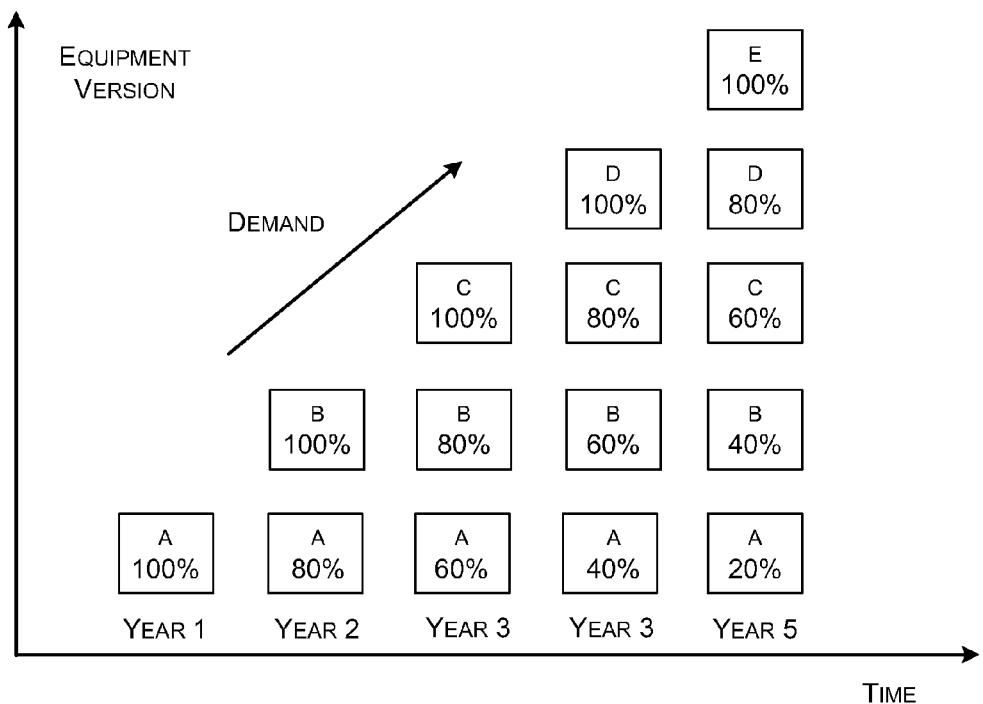
FIG. 16 is a graph that depicts an illustrative manner in which part items can be added to a data center over time; the figure also conveys an illustrative manner in which part items may degrade in performance over time.
Figure 17:
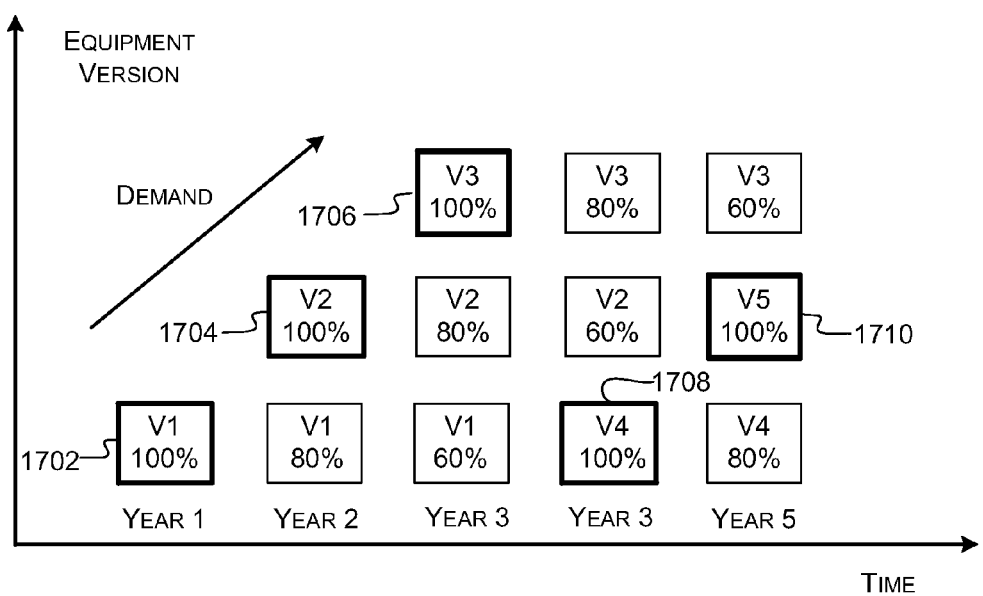
FIG. 17 is a graph that depicts an illustrative manner in which part items can be replaced over time.
Figure 18:
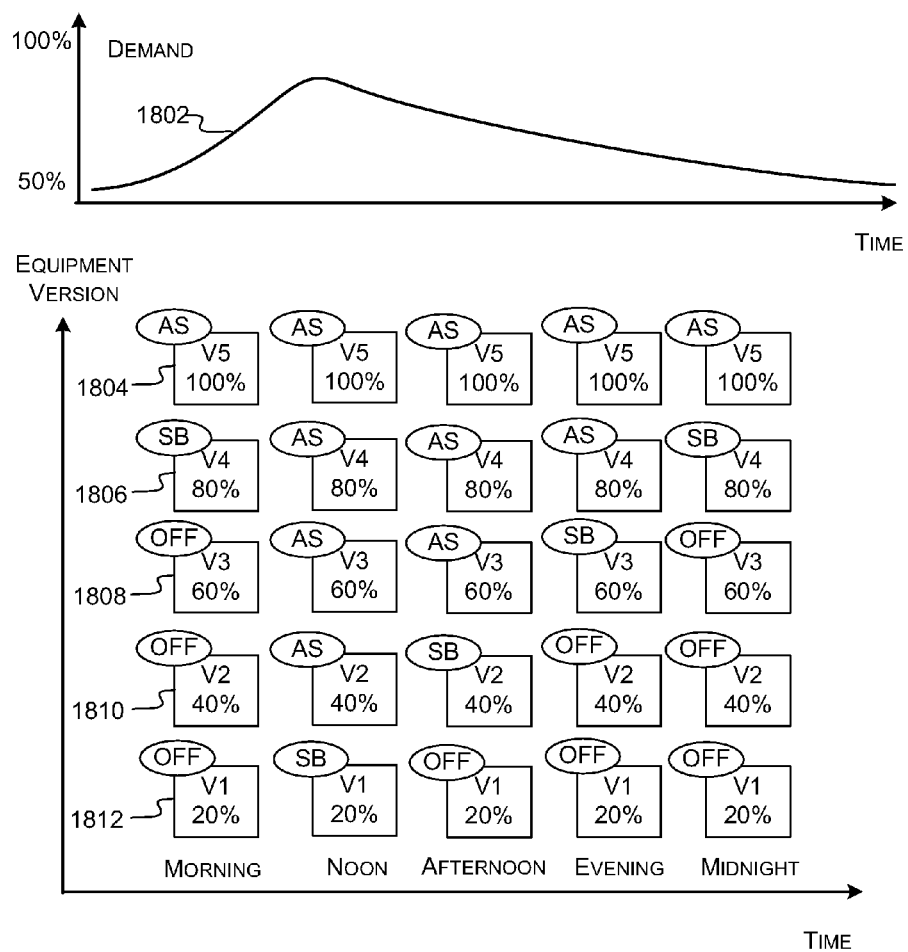
FIG. 18 is a graph that depicts an illustrative manner in which part items can be placed in various states to meet processing demand as a function of time.
Figure 19:
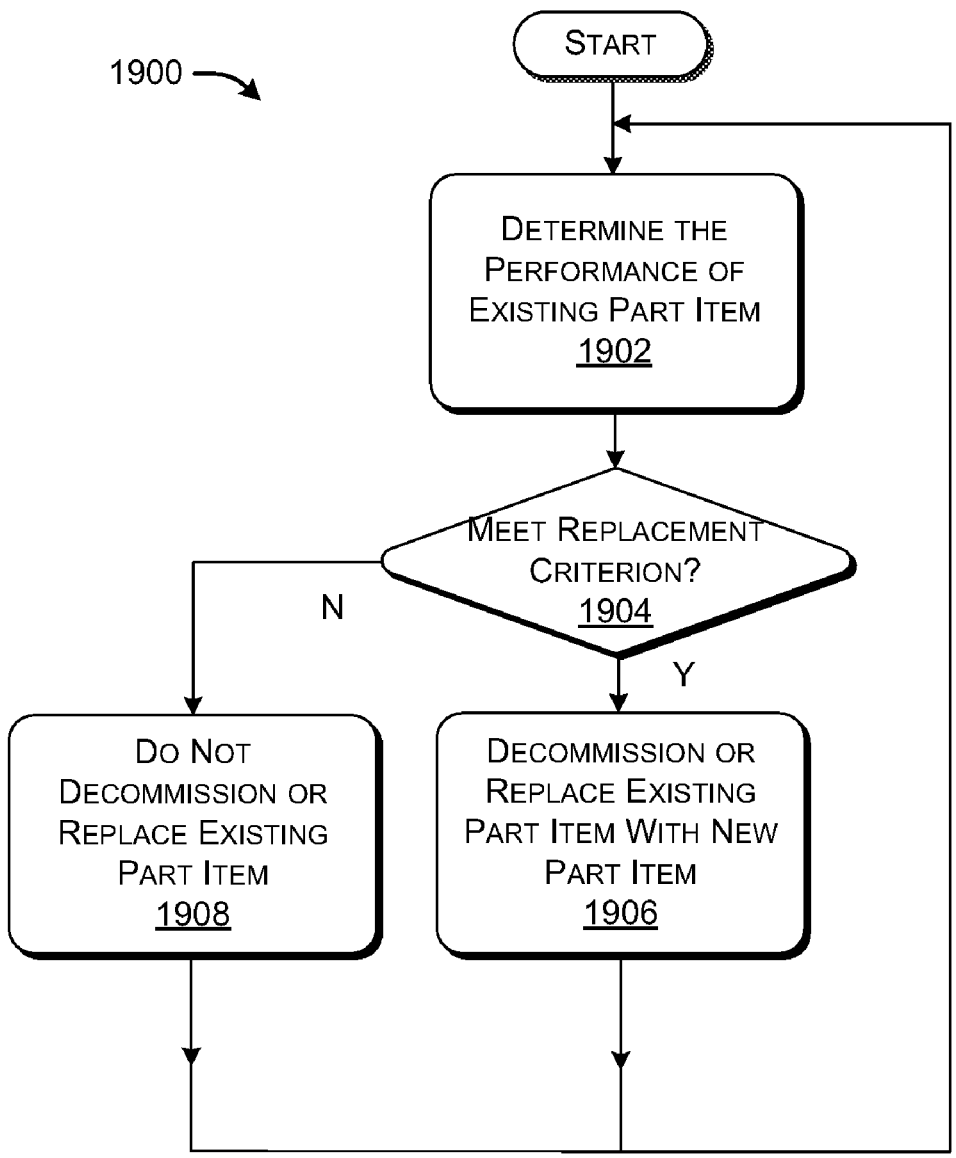
FIG. 19 is a flowchart that shows an illustrative procedure for replacing part items.
Figure 20:
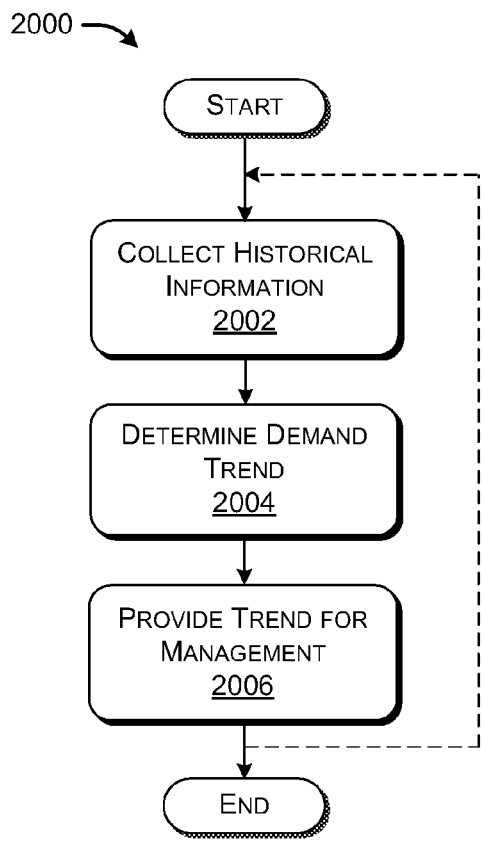
FIG. 20 is a flowchart that shows an illustrative procedure for determining a trend that estimates a processing demand that will be placed on a data center.
Figure 21:
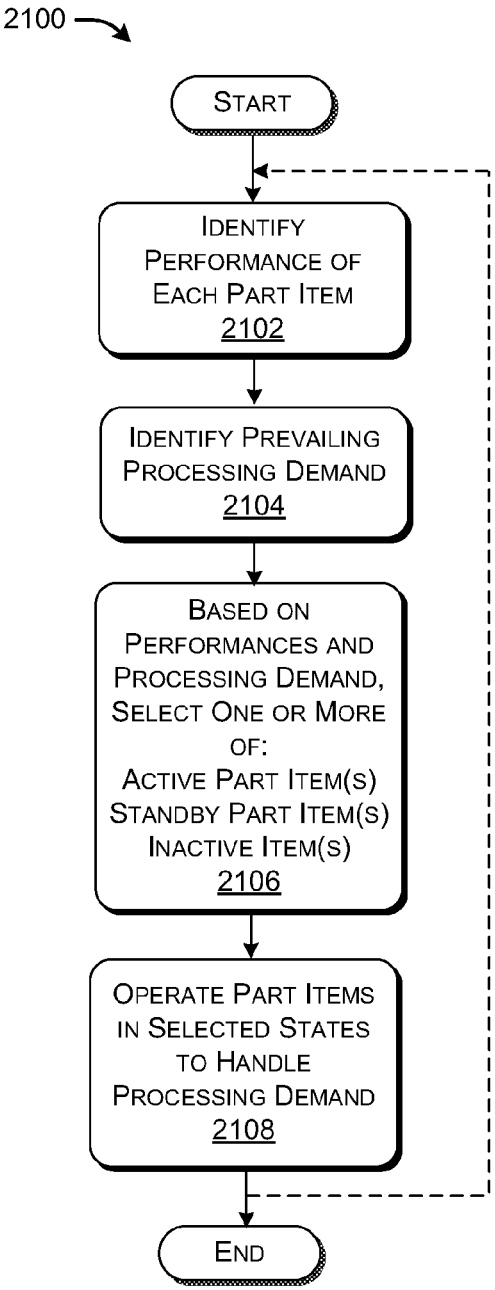
FIG. 21 is a flowchart that shows an illustrative procedure for placing part items in various states to meet processing demand.

FIGS. 16-18 illustrate the above-described operation of the system 1500 in graph form. FIGS. 19-21 illustrate the operation of the system 1500 in flowchart form.

Starting with FIG. 16, this graph shows an evolution of data center infrastructure over time with increasing demand placed on a data center. Each block in the graph represents a part item (e.g., a data center unit, a resource item, a data processing module, or some other component of a data center). Each column of the graph represents a particular year. At year one, the data center includes a single part item (labeled "A"), which operates at 100% (because it is new). Any performance parameter or combination of parameters can be used to assess performance in this scenario. For example, the performance of a part item can reflect the overall health of the part item, which, in turn, may reflect the number of failed subparts in the part item (which may ultimately correspond to the number of failed data processing modules in the part item). At year two, an administrator adds another part item (labeled "B"), which operates at 100%. At this time, the preexisting part item A has degraded in performance to 80%. And so this process continues; each year the administrator may choose to add one or more part items, while preexisting part items continue to degrade. For example, in the final year, the part item A has degraded to 20%.

In FIG. 16, each successive part item added to the data center may represent a new version of the processing technology used by the subpart items. Accordingly, at any given time, the data center may include a mosaic of different versions of processing technology. The "boundaries" in the data center which demarcate different versions are defined by the part items, because, in one case, no servicing is performed on individual subpart items (e.g., resource items).

FIG. 17 is another graph that shows the evolution of the data center over time with increasing demand. In the case of FIG. 17, the administrator has chosen to replace any part item that has a performance (e.g., an overall health) equal to or below 40%. In year one, the administrator adds a first part item 1702, corresponding to version 1 (V1) of the processing technology. In year two, the administrator adds a second part item 1704, corresponding to version 2 (V2) of the processing technology. Note that, at this time, the first part item 1702 is now performing at a health-level of 80%. Also keep in mind that the first part item 1702 (corresponding to version V1) likely has a lower efficiency than the second part item 1704 (corresponding to version V2). In year three, the administrator adds a third part item 1706, corresponding to version 3 (V3) of the processing technology. In year four the administrator replaces first part item 1702 with a replacement part item 1708, corresponding to version 4 (V4) of the processing technology; this is because first part item 1702 had reached a performance level (e.g., a health level) of 40%. In year five, the administrator has replaced the second part item 1704 with a replacement part item 1710, corresponding to version 5 (V5) of the processing technology; this is because the second part item 1704 had reached a performance level of 40%.

FIG. 18 shows how the management module 1526 (of FIG. 15) can be used to allocate part items to handle processing demand. The processing demand is reflected by trend information 1802. The management module 1526 performs this function by selecting various part items to operate in prescribed states, and then using the part items to handle the processing demand in accordance with their assigned states. Three such states were discussed above, including active (labeled in FIG. 18 as "AS" for Active State), standby (labeled in FIG. 18 as "SB" for Standby State), and inactive (labeled in FIG. 18 as "OFF" for Inactive State, which can be powered off). The standby part items handle processing tasks that cannot be met by the active part items, while the inactive part items handle processing tasks that cannot be handled by either the active or standby part items. Although only three states are used in this example, in other cases, more than or fewer than three states can be used. For example, additional states can be added to increase the granularity of the responsiveness provided by the management module 1526.

In the representative example of FIG. 18, the management module 1526 operates a series of five part items in three different states depending on the time of day (morning, noon, afternoon, evening, and midnight). In the morning time slot, the management module 1526 selects part item 1804 to operate in an active state and part item 1806 to operate in the standby state. The remaining part items (1808, 1810, and 1812) are placed in inactive state. The management module 1526 selects the part item 1804 to operate in the active mode because it has been determined to be the most efficient part item. The management module 1526 can decide that this part item 1804 has the best performance because it has the latest version of the processing technology. Alternatively, or in addition, the management module 1526 can determine that this part item 1804 has the best performance by, for example, measuring its performance per energy consumption unit (e.g., watt).

The noontime slot corresponds to the peak load experienced by the data center. To address this load, the management module 1526 operates part items 1804, 1806, 1808, and 1810 in an active state. The remaining part item (part item 1812) is operated in a standby state. In the following time slots, the demand successively decreases. As such, the management module 1526 tapers back on the number of part items that it operates in active state.

The trend information 1802 may reflect the actual experienced demand that is placed on the data center. Or the trend information 1802 may reflect the anticipated demand that will be placed on the data center (e.g., as determined by the trend determination module 1534). In the latter case, the management module 1526 can place the part items in their selected states just prior to experiencing the actual demand that has been forecast. The management module 1526 can alternatively select operating state based on a combination of experienced demand and anticipated demand. For example, the management module 1526 can select a buffer of extra processing resources that is based on any function of actual usage needs and/or estimated usage needs (e.g., based on historical and/or statistical data).

In the case of FIG. 18, daily changes in demand may make it appropriate to make use of standby part items (e.g., as buffer resources). In other cases, the processing demand may vary more slowly. For example, the processing demand placed on a shopping site may experience a peak in the month of December, but is otherwise relatively flat. In these scenarios, management module 1526 can dispense with the use of standby part items. This is because there is sufficient time to turn inactive parts on to meet increased processing demand.

FIGS. 19-22 illustrate the operation of the system 1500 (or some other system) in flowchart form. To facilitate discussion, certain operations are described as constituting distinct blocks performed in a certain order. Such implementations are illustrative and non-limiting. Certain blocks described herein can be grouped together and performed in a single operation, and certain blocks can be performed in an order that differs from the order employed in the examples set forth in this disclosure. The blocks shown in the flowcharts can be implemented by software, firmware, hardware, manual processing, any combination of these implementations, and so on.

As the functions identified by the flowcharts have already been described above, the following description of these figures will serve as a summary and review of those functions.

Starting with FIG. 19, this flowchart shows a procedure 1900 for replacing part items. The management module 1526, in part, can perform this operation. In block 1902, the management module 1526 determines the performance (e.g., health) of an existing part item. In block 1904, the management module 1526 determines whether the performance meets a prescribed replacement criterion (or plural replacement criteria). If block 1904 is answered in the affirmative, then, in block 1906, an administrator is notified, upon which this person can replace the existing part item with a replacement part item. Instead of replacing the part item, block 1906 can alternatively entail decommissioning it (assuming that it is not intended to be used again), e.g., by shutting it off and transferring its processing tasks to a more efficient part item or items. If block 1904 is answered in the negative, then, in block 1908, the administrator does not replace the existing part item; nor is the existing part item decommissioned. In one case, note that one or more subpart items in the existing part item may have failed; yet, unless the existing part item as a whole is ready for replacement, the administrator does not service these defective subpart items.

FIG. 20 shows a procedure 2000 for determining trend information based on historical load information. The historical data collection module 1536 and the trend determination module 1534 of FIG. 15 may perform this operation. In block 2002, the historical data collection module 1536 collects historical load information from a data center, and optionally from other sources. In block 2004, the trend determination module 1534 uses the collected historical load information to determine trend information; the trend information estimates the processing demand that will be placed on the data center in the future. In block 2006, the trend determination module 1534 supplies the trend information to the management module 1526 for its use in managing the data center.

FIG. 21 shows a procedure 2100 for operating part items in different states. The management module 1526 can perform this operation. In block 2102, the management module 1526 identifies the performances (e.g., efficiencies) of the part items. In block 2104, the management module 1526 identifies the anticipated and/or actual experienced processing demand placed on the part items. In block 2106, the management module 1526 selects one or more part items to operate in prescribed states, selected among, for instance, an active state, a standby state, and an inactive state (although additional or fewer states can be used). In block 2108, the management module 1526 operates the selected part items in their selected states to handle the processing demand. This may also involve transferring application tasks to selected part items using virtualization and migration tools.

Figure 22:
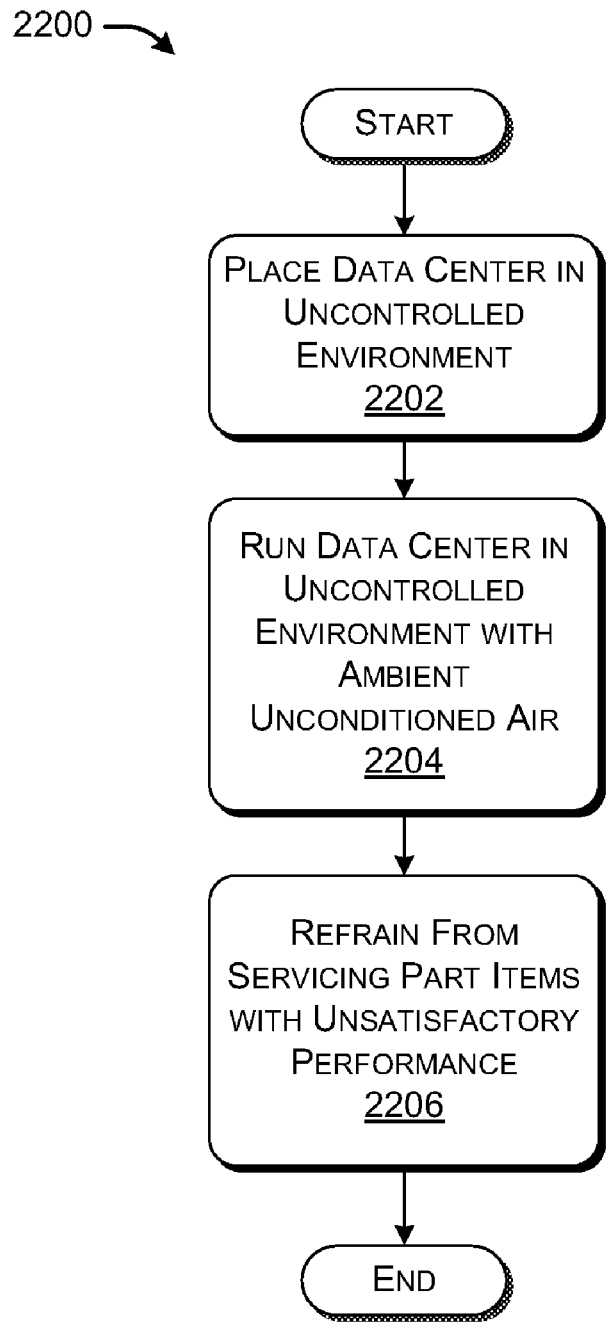
FIG. 22 is a flowchart that shows an overview of one illustrative use of a power-efficient data center.

FIG. 22 shows a procedure 2200 that represents an overview of one illustrative use of a power-efficient data center. This procedure 2200 ties the concepts disclosed in Section A with the concepts disclosed in Section B; however, as stated, the concepts disclosed in Sections A and B can also be independently applied. Block 2202 entails placing a data center in an uncontrolled environment. Block 2204 entails running the data center in the uncontrolled environment, wherein the running includes supplying ambient unconditioned air from the uncontrolled environment to part items used by the data center. Block 2206 entails refraining from servicing individual part items that exhibit unsatisfactory performance.

The power-efficient data center can also be operated in a controlled environment. In this case, the power-efficient data center can still reduce costs by using one or more of the strategies described above, such as by making use of stripped down "one use" part items.

C. Representative Processing Functionality

FIG. 23 sets forth illustrative processing functionality 2300 that can be used to implement any aspect of functions described above. With reference to FIG. 15, for instance, the processing functionality 2300 can be used to implement any aspect of the control module 1502 or any of its component modules. In addition or alternatively, the processing functionality 2300 can be used to implement any of the electronic devices (1506, 1508, . . . 1510). In addition or alternatively, the processing functionality 2300 can be used to implement any aspect of the data center 1504; for instance, parts of the processing functionality 2300 can be used to implement an individual data processing module. Still other applications are possible.

The processing functionality 2300 can include volatile and non-volatile memory, such as RAM 2302 and ROM 2304, as well as one or more processing devices 2306. The processing functionality 2300 also optionally includes various media devices 2308, such as a hard disk module, an optical disk module, and so forth. The processing functionality 2300 can perform various operations identified above when the processing device(s) 2306 executes instructions that are maintained by memory (e.g., RAM 2302, ROM 2304, or elsewhere). More generally, instructions and other information can be stored on any computer-readable medium 2310, including, but not limited to, static memory storage devices, magnetic storage devices, optical storage devices, and so on. The term computer-readable medium also encompasses plural storage devices. The term computer-readable medium also encompasses signals transmitted from a first location to a second location, e.g., via wire, cable, wireless transmission, etc.

The processing functionality 2300 also includes an input/output module 2312 for receiving various inputs from a user (via input modules 2314), and for providing various outputs to the user (via output modules). One particular output mechanism may include a presentation module 2316 and an associated graphical user interface (GUI) 2318. The processing functionality 2300 can also include one or more network interfaces 2320 for exchanging data with other devices via one or more communication conduits 2322. One or more communication buses 2324 communicatively couple the above-described components together.

In closing, the description may have described various concepts in the context of illustrative challenges or problems. This manner of explication does not constitute an admission that others have appreciated and/or articulated the challenges or problems in the manner specified herein.

More generally, although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A system for managing a power-efficient data center that includes a plurality of part items, each part item comprised of one or more computers, comprising:
   a trend determination module estimating a processing demand that will be placed on the power-efficient data center, to provide an estimated processing demand;
   a management module controlling the plurality of part items, comprising:
      a performance determination module assessing respective performances of the plurality of part items in the power-efficient data center to provide a plurality of respective performance results, wherein a performance result of a part item corresponds to a computation-to-power efficiency of the part item, wherein computation-to-power efficiency refers to a ratio of computation performed per energy used to perform the computation;
      a selection module using the performance results and the estimated processing demand to assign respective operating states to the plurality of part items, the states selected from amongst at least an active state associated with a first state of part item availability, a standby state associated with a second state of part item availability, and an inactive state associated with a third state of part item availability, wherein the part items, in an order of priority from highest performance results to lowest performance results, are first assigned to the active state, then the standby state, and then the inactive state, whereby computation by part items with high computation-to-power efficiency is maximized; and
      an application module operating the plurality of part items in the states assigned by the selection module to meet the processing demand that is estimated by the trend determination module.

2. The system of claim 1, wherein each of the plurality of part items comprises a data center unit, and wherein the data center unit includes a plurality of resource items, and wherein each of the plurality of resource items includes a plurality of computers.

3. The system of claim 2, wherein each computer of each resource item provides a network-accessible service to a plurality of electronic devices.

4. A method of managing a power-efficient data center that includes a plurality of part items, comprising:
   assessing the respective performances of computers in the power-efficient data center to provide a plurality of respective efficiency indicators, an efficiency indicator corresponding to a computation-to-power efficiency of a corresponding computer, wherein computation-to-power efficiency refers to a ratio of computation performed per energy used to perform the computation;
   assigning, based on the efficiency indicators and processing demand, respective operating states to the computers by assigning the computers different operating states in order of descending computation-to-power efficiency; and
   operating the computers according to their respective assigned operating states such that computers with the active operating state are powered and in operation, computers with the standby operating state are operated in a standby power mode, and computers with the inactive operating state are not powered.

5. The method of claim 4, wherein the operating states comprise an inactive state, an active state, and a standby state.

6. The method of claim 5, further comprising operating the computers according to the assigned operating states such that computers assigned the active operating state are powered and in operation, computers assigned the standby operating state are operated in a standby power mode, and computers assigned the inactive operating state are not powered.

7. The method of claim 4, wherein the processing demand is based on actual processing demand, or estimated processing demand, or a combination of both actual processing demand and estimated processing demand.

8. The method of claim 4, further comprising treating at least one part item in the power-efficient data center as decommissioned based on the performance results.

9. The method of claim 4, further comprising replacing at least one part item in the power-efficient data center with a respective replacement part item based on the performance results.

10. The method of claim 4, wherein each of the plurality of part items comprises a data center unit, and wherein the data center unit includes a plurality of resource items, and wherein each of the plurality of resource items includes a plurality of data processing modules.

11. The method of claim 10, wherein each data processing module of each resource item provides a network-accessible service to a plurality of electronic devices.

12. The method of claim 4, wherein each part item includes subpart items that share a same version of processing technology.

13. The method of claim 12, wherein at least one part item that has been selected to operate in the active state and includes subpart items that share a most recent version of processing technology.

* * * * *

UNITED STATES PATENT AND TRADEMARK OFFICE
CERTIFICATE OF CORRECTION

PATENT NO. : 8,032,767 B2  
APPLICATION NO. : 12/060876  
DATED : October 4, 2011  
INVENTOR(S) : Christian L. Belady et al.

It is certified that error appears in the above-identified patent and that said Letters Patent is hereby corrected as shown below:

Title page, Item (57), "Abstract", line 4, after "to" insert -- its --.

Signed and Sealed this  
Twenty-second Day of November, 2011

David J. Kappos  
*Director of the United States Patent and Trademark Office*